(12) United States Patent
Okita et al.

(10) Patent No.: US 7,064,423 B2
(45) Date of Patent: Jun. 20, 2006

(54) IC MODULE AND IC CARD

(75) Inventors: Yoshitaka Okita, Nabari (JP); Masataka Nishikawa, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 42 days.

(21) Appl. No.: 10/863,291

(22) Filed: Jun. 9, 2004

(65) Prior Publication Data
US 2005/0007744 A1 Jan. 13, 2005

(30) Foreign Application Priority Data
Jul. 10, 2003 (JP) .............................. 2003-195278

(51) Int. Cl.
*H01L 23/02* (2006.01)
*G06K 19/06* (2006.01)
*H01K 1/14* (2006.01)

(52) U.S. Cl. ............... 257/679; 257/678; 257/415; 257/737; 257/690; 257/692; 235/491; 235/492; 235/451; 235/7; 361/737; 361/728; 174/250; 157/679; 427/135

(58) Field of Classification Search ............... 257/678, 257/679, 690, 692, 396, 415, 737, E23.013, 257/E23.027; 361/737, 728; 235/492, 491, 235/451, 7; 174/250; 157/679; 427/135
See application file for complete search history.

(56) References Cited

U.S. PATENT DOCUMENTS

| | | | |
|---|---|---|---|
| 4,942,495 A | 7/1990 | Peres et al. ................. 361/220 |
| 5,975,420 A * | 11/1999 | Gogami et al. ............. 235/492 |
| 6,271,801 B1 * | 8/2001 | Tuttle et al. ................. 343/872 |
| 6,326,683 B1 * | 12/2001 | Houdeau et al. ............. 257/679 |
| 6,568,600 B1 * | 5/2003 | Carpier et al. ............. 235/492 |
| 6,642,611 B1 * | 11/2003 | Iwasaki ....................... 257/679 |
| 6,803,666 B1 * | 10/2004 | Takahashi et al. .......... 257/784 |
| 6,896,189 B1 * | 5/2005 | Guion et al. ................. 235/492 |

FOREIGN PATENT DOCUMENTS

JP    5-262081    10/1993

* cited by examiner

*Primary Examiner*—Kenneth Parker
*Assistant Examiner*—Chris Chu
(74) *Attorney, Agent, or Firm*—Harness, Dickey & Pierce, PLLC

(57) ABSTRACT

Each of contact terminals, provided on a substrate of an IC module so as to be positioned on a back surface of a surface having an IC chip, which are terminals other than a GND terminal, has a curved convex face, and the GND terminal has a curved concave face as a counter face opposite to the curved convex face of the contact terminal so that there is a constant gap between the curved convex face and the curved concave face, and a gap between the GND and each of the contact terminals other than the GND terminal is narrower than a gap between all the contact terminals other than the GND terminal provided on the substrate so as to be positioned on the back surface of the surface having the IC chip. Thus, it is possible to provide an IC module and an IC card each of which enables the IC card's strength with respect to bending to be secured, and facilitates process thereof, and enables the IC chip to be protected from static electricity.

18 Claims, 12 Drawing Sheets

US 7,064,423 B2

IC MODULE AND IC CARD

This Nonprovisional application claims priority under 35 U.S.C. § 119(a) on Patent Application Ser. No. 2003/195278 filed in Japan on Jul. 10, 2003, the entire contents of which are hereby incorporated by reference.

FIELD OF THE INVENTION

The present invention relates to (i) a so-called IC module, i.e., a semiconductor device in which: an IC chip is electrically connected to a print wiring substrate, and an external connection terminal for allowing electrical connection with outside is provided on the print wiring substrate so as to be positioned on a back surface of a surface having the IC chip, and to (ii) an IC card having the IC module. More specifically, the present invention relates to an IC module and an IC card each of which is arranged so that an IC chip included therein is protected from static electricity.

BACKGROUND OF THE INVENTION

An IC module is a semiconductor device in which: an IC (integrated circuit) chip is electrically connected to a substrate such as a print wiring substrate, and a terminal for allowing electrical connection with outside is provided on the print wiring substrate so as to be positioned on a back surface of a surface having the IC chip.

FIG. 9 is a cross sectional view schematically showing a general IC module.

As shown in FIG. 9, generally, an IC module is arranged so that: one surface of an insulating support substrate 101 (substrate such as a print wiring substrate or the like) includes contact terminals 102 (electrical connection terminal), functioning as connection terminals for allowing connection with outside, each of which is constituted of an input/output contact terminal capable of external access, and the other surface of the insulating support substrate 101 includes an IC chip 103. The contact terminals 102 and terminals of the IC chip 103 are connected to each other via through holes 104 provided in the insulating support substrate 101, wiring patterns (not shown) provided on the insulating support substrate 101, and the like, so that the contact terminals 102 and the IC chip 103 are electrically connected to each other.

The IC module is mounted on an IC card for example. In this manner, the IC module mounted on the IC card is always exposed to an electrostatic condition since the IC card is brought with a user as a portable device. Originally, the IC chip 103 itself provided in the IC card includes an ESD (electrostatic discharge) protection circuit, such as an electrostatic protection diode, provided on an input/output section of the IC chip 103, which functions as a protection circuit (excessive voltage protection element) for preventing electrostatic damage.

However, in case where static electricity is applied to each of the contact terminals 102 provided on a surface of the IC module exposed at a surface of the IC card, the static electricity enters into the IC chip 103 via each of the through holes 104. At this time, when strength of the static electricity is allowable for the IC chip 103, an electrostatic stress caused by the static electricity is absorbed in the IC chip 103. However, when the electrostatic strength is not allowable for the IC chip 103, it is impossible to absorb all the electrostatic stress caused by the static electricity, so that an input/output terminal (not shown) of the IC chip 103 is damaged or broken.

The following description explains a structure of the contact terminal 102 of the IC module.

A module terminal of a contact-type IC card is defined under ISO7816. FIG. 10 is a plan view schematically showing a layout in which the contact terminals 102 of each module terminal of the contact-type IC card are disposed in accordance with definition of ISO7816.

As shown in FIG. 10, the module terminal of the contact-type IC card is defined under ISO7816. As shown in FIG. 10, the module terminal includes as the contact terminals 102 shown in FIG. 9: a GND terminal 204 which is a ground terminal for a reference potential; a VCC terminal 208 and a VPP terminal 203 each of which is a terminal for power source; a CLK terminal 206 which is a terminal for inputting a clock; an RST terminal 207 which is a terminal for inputting a reset signal; an I/O terminal 202 which is a terminal for inputting/outputting data; and an $RFU_0$ terminal 201 and an $RFU_1$ terminal 205 each of which functions as an extension input/output terminal (Reserve For User terminal). Out of the contact terminals 102 constituting the IC module, the GND terminal 204 is disposed adjacent to all the other contact terminals 102.

The layout in the module terminal of the IC card is determined under ISO7816 in this manner. However, each contact terminal 102 constituting the module terminal has an arbitrary shape.

In the IC module shown in FIG. 10, a distance d between the contact terminals 102 is uniformly 150 µm for example. However, when the distance between the contact terminals 102 is uniformed in this manner, the following disadvantage occurs. That is, in case where static electricity is applied to the contact terminal 102 and the surge discharge (electric arc) aerially occurs between the contact terminals 102 adjacent to each other before the static electricity is absorbed by the IC chip 103 (see FIG. 9) via the through hole 104, the surge discharge may occur also in the contact terminal 102 (input/output contact terminal), disposed adjacent to that contact terminal 102, which is a terminal other than the GND terminal 204. When the surge discharge is applied to the adjacent contact terminal 102 (input/output contact terminal), the surge discharge enters into the IC chip 103 via the through hole 104 of the adjacent contact terminal 102 (input/output contact terminal), so that the surge discharge may brake the IC chip.

Then, efforts are made so as to protect the input/output terminal of the IC chip 103 from the static electricity by leading the surge discharge caused by the static electricity to the GND terminal 204 in the case where the static electricity which occurs in the contact terminal 102 causes the surge discharge.

FIG. 11 is a plan view schematically showing an IC module formation portion of an IC card recited in Japanese Unexamined Patent Publication No. 146796/1989 (Tokukaihei 1-146796)(publication date: Jun. 8, 1989: hereinafter, referred to as Patent Document 1: Corresponding U.S. Pat. No. 4,942,495).

The IC module shown in FIG. 11 is arranged so that: surge discharge (electric arc) which occurs between the contact terminal 102 and another contact terminal 102 other than the GND terminal 301, i.e., between the input/output contact terminal 302 and the GND terminal 301 is promoted, and a minimum voltage required in occurrence of the surge discharge is reduced, thereby reducing an excessive voltage applied to the input/output contact terminal 302. Thus, a plurality of metal protruding portions 301a and a plurality of metal protruding portions 302a are respectively provided on the GND terminal 301 and the input/output contact terminal 302 which is the contact terminal 102 other than the GND terminal 301, thereby reducing a shortest distance e between the GND terminal 301 and the input/output contact terminal 302 other than the GND terminal 301 so that the distance e is less than 100 µm.

Further, each of FIG. 12 and FIG. 13 is a plan view showing an example of a schematic arrangement of an IC module formation portion of an IC card recited in Japanese Unexamined Patent Publication No. 262081/1993 (Tokukaihei 5-262081)(publication date: Oct. 12, 1993: hereinafter, referred to as Patent Document 2).

In the IC module shown in FIG. 12, a gap f between (i) an input/output contact terminal 402 sending a surge discharge (electric arc) component and (ii) a GND terminal which functions as an input/output contact terminal 402 receiving the surge discharge (electric arc) component is set to be uniformly narrower than a gap g between input/output contact terminals 402, disposed adjacent to each other, which are terminals other than the GND terminal 401.

Further, an IC module shown in FIG. 13 is arranged so that: a protruding portion 402a is provided on a side face, included in an input/output contact terminal 402, which is positioned opposite to a side face of an extended portion 401a of a GND terminal 401 functioning as an input/output contact terminal 402 receiving the surge discharge (electric arc) component, thereby setting a gap h between the protruding portion 402a and the extended portion 401a of the GND terminal 401, i.e., a gap between the GND terminal 401 and the input/output contact terminal 402 other than the GND terminal 401, to be narrower than a gap g between the input/output contact terminals 402, disposed adjacent to each other, which are terminals other than the GND terminal 401.

However, the Patent Document 1 gives no consideration for an impulse current component contained in the surge discharge (electric arc) component which occurs between the contact terminals 102 other than the GND terminal 301.

A distance between the contact terminals 102 of the IC module is generally several hundreds µm (for example, 150 µm in FIG. 10). When electric field intensity caused by static electricity which occurs in the contact terminal 102 exceeds dielectric strength (breakdown voltage) of air which exists between the contact terminal 102 and another contact terminal 102 adjacent to that contact terminal 102, the surge discharge occurs. It is known that the breakdown voltage of air is approximately 100 kV/cm. When static electricity applied to the contact terminal 102 reaches electric field intensity over approximately 100 kV/cm, the static electricity is discharged toward the adjacent contact terminal 102 as the surge discharge (electric arc).

A demonstration experiment demonstrates that the surge discharge component contains a special impulse current component which is approximately three times as strong as general electrostatic strength in a human body model (HBM).

Thus, when the surge discharge component occurs, the electrostatic strength exerted to the adjacent contact terminal 102 is higher than the electrostatic strength in case where the static electricity is applied directly to the IC module. When an excessive voltage protection element (ESD protection circuit) provided in a general IC chip 103 cannot allow the special impulse current component, the IC chip 103 is damaged or broken.

The Patent Document 1 aims to protect the circuit by intentionally causing the surge discharge (electric arc) component. Thus, the plurality of metal protruding portions 301a and the plurality of metal protruding portions 302a are respectively provided on the GND terminal 301 and the input/output contact terminal 302 other than the GND terminal 301 as described above, thereby reducing a shortest distance e between the GND terminal 301 and the input/output contact terminal 302 other than the GND terminal 301. Therefore, in the IC module recited in the Patent Document 1, when the static electricity occurs in the GND terminal 301, also the surge discharge from the GND terminal 301 to the input/output contact terminal 302 other than the GND terminal 301 is likely to occur.

Thus, in the IC module recited in the Patent Document 1, the IC chip 103 (see FIG. 9) repeatedly receives the impulse current component every time the static electricity occurs in the IC module.

That is, in the IC card recited in the Patent Document 1, the plurality of metal protruding portions 301a and the plurality of metal protruding portions 302a are respectively provided on the GND terminal 301 and the input/output contact terminal 302, that are provided on a surface of the IC card, with the metal protruding portions 301a and 302a positioned opposite to each other. Thus, the surge discharge occurs between each metal protruding portion 301a and each metal protruding portion 302a on the surface of the IC card. Moreover, there is no telling which one of the metal protruding portions 301a and 302a the surge discharge (electric arc) component is transmitted to. Since the IC card is brought with a user, as a portable device, the surge discharge occurs in the surface of the IC card several times depending on a condition under which the IC card is used. Thus, the impulse component contained in the surge discharge (electric arc) may cause wirings and the like provided on the insulating support substrate 101 (see FIG. 9) to be burned out.

Further, in a general withstand electrostatic voltage strength evaluation test), there are two types of the test: the test is carried out in terms of a GND terminal basis (the GND terminal is connected to a GND potential of an evaluation apparatus (the GND terminal is grounded)) and the test is carried out in terms of a VCC basis (a VCC terminal is connected to the GND potential of the evaluation apparatus (the VCC terminal is grounded)). In case of the latter, it is highly probable that: in the module structure of the Patent Document 1 arranged so as to intentionally cause the surge discharge, static electricity which occurs in the GND terminal 301 facilitates occurrence of the surge discharge which occurs from the GND terminal 301 to another contact terminal 102 adjacent to the GND terminal 301.

Taking into consideration the impulse current component contained in the surge component in this manner, the structure of the IC module recited in the Patent Document 1 is not effective in protecting the IC chip from the ESD.

Further, high accuracy is required in processing the plurality of metal protruding portions so that a terminal distance therebetween is less than 100 µm, and this causes productivity to drop. Moreover, the metal protruding portions 301a and the metal protruding portions 302a are respectively provided on a surface opposite to the GND terminal 301 and the input/output contact terminal 302 other than the GND terminal 301, and each of the metal protruding portions 301a and 302a is extremely small, so that electric fields are likely to gather in an end (end of the protruding portion) of each of the metal protruding portions 301a and 302a at the time of the surge discharge. As a result, the end of the protruding portion tends to be damaged.

As described above, the IC card is used as a device brought with the user as a portable device, so that its reliability is required to be higher than other conventional IC cards. Thus, it is considered that: a shape of each input/output contact terminal 302 of the IC module recited in the Patent Document 1 is disadvantageous in using the IC card.

Meanwhile, the IC module recited in the Patent Document 2 is arranged so that: the GND terminal 401 is formed in a straight line pattern, so that a gap between the GND terminal 401 and the input/output contact terminal 402 other than the GND terminal 401 is set to be narrower than a gap between the input/output contact terminals 402, disposed adjacent to each other, which are terminals other than the GND terminal 401, without forming a protruding portion on the GND terminal 401 unlike Patent Document 1. Thus, according to the Patent Document 2, when static electricity is applied to the input/output contact terminal 402, it is possible to preferentially lead the surge discharge caused by the static electricity to the GND terminal 204.

However, in the input/output contact terminal 402 of the Patent Document 2, the GND terminal 401 is formed in a straight line pattern, so that each side face of the extended portion 401a of the GND terminal 401 has a straight line shape. Thus, when the IC card is bent, a mechanical stress is exerted to the gap between the GND terminal 401 and the input/output contact terminal 402 other than the GND terminal 401. This is likely to result in chip breakage.

Further, each of the Patent Document 1 and the Patent Document 2 gives no consideration for the surge discharge in case where a non-connection terminal (hereinafter, referred to as NC terminal) is provided as a reserve terminal (preparatory terminal).

That is, in FIG. 10, it is necessary to completely disconnect some contact terminals 102 constituting the IC module, that is, the $RFU_0$ terminal 201, the $RFU_1$ terminal 205, each of which is an extension input/output terminal, and the VPP terminal 203 for data writing power source, from the IC chip 103, depending on specifications of the IC module, so as to make the foregoing contact terminals 102 completely in an electrically floating state.

In case where the NC terminal is provided on the surface of the IC module as the contact terminal 102 (see FIG. 9), the static electricity applied to the NC terminal is not absorbed by the IC chip 103, and all the static electricity is applied to air between the NC terminal and the contact terminal 102 adjacent to the NC terminal.

When the static electricity applied between the NC terminal and the contact terminal 102 adjacent to the NC terminal reaches electric field intensity over approximately 100 kV/cm which is a breakdown voltage of air, the surge discharge (electric arc) occurs from the NC terminal to the contact terminal 102 adjacent to the NC terminal.

Thus, the surge discharge from the NC terminal is more likely to occur than the surge discharge which occurs from other contact terminal 102.

As described above, it is apparent that the surge discharge component contains a special impulse current component which is approximately three times as strong as general static electricity of a human body model (HBM). Thus, when the surge discharge (electric arc) component occurs from the NC terminal, the electrostatic strength exerted to the adjacent contact terminal 102 is higher than the electrostatic strength in case where the static electricity is applied directly to the IC module. In case where an excessive voltage protection element provided in a general IC chip 103 cannot allow the special impulse current component, the IC chip 103 is damaged or broken.

Therefore, an effective withstand voltage against the static electricity of the IC module having the NC terminal may be lower than an IC module having no NC terminal. When the NC terminal is provided on the IC module, the IC chip is more likely to be damaged or broken than the IC module having no NC terminal.

Generally, a distance between the contact terminals 101 provided on the surface of the IC module is several hundreds µm (for example, 150 µm in FIG. 10). Since electrostatic charge on a human body reaches several kV and the NC terminal is completely in an electrically floating state, there is no discharge path for discharging the static electricity applied to the NC terminal to the IC chip 103, and the static electricity gathers in air between the NC terminal and the adjacent contact terminal 102. In terms of these conditions, it can be said that: the surge discharge (electric arc) component discharged from the NC terminal to which the static electricity has been applied is highly likely to influence the contact terminal 102 adjacent to the NC terminal.

Particularly, the IC module shown in FIG. 10 is arranged so that: the distance between the contact terminals 102 is uniformed, and the NC terminal constitutes a protruding pattern 209 which protrudes toward the contact terminal 102 adjacent thereto, thereby accelerating the surge component to the adjacent contact terminal 102. Therefore, in the IC module having the structure shown in FIG. 10, when the NC terminal is provided, the surge discharge component discharged from the NC terminal is highly likely to be applied not to the GND terminal but to the contact terminal 102. Thus, it can be said that the IC chip is highly likely to be damaged or broken by the special impulse current component contained in the surge discharge component.

SUMMARY OF THE INVENTION

The object of the present invention is to provide an IC module and an IC card each of which enables the IC card's strength with respect to bending to be secured, and facilitates process thereof, and enables an IC chip to be protected from static electricity.

In order to achieve the foregoing object, the IC module according to the present invention includes: an IC chip provided on one surface of a substrate; and a terminal group, constituted of a plurality of terminals adjacent to each other, which is provided on a back surface of the surface having the IC chip, one of the terminals being a ground terminal, other terminals being constituted of a plurality of external connection terminals electrically connected to the IC chip, wherein: the ground terminal is disposed adjacent to each of the terminals, provided on the back surface of the surface having the IC chip, so as to have a constant gap (gap a) between the ground terminal and each of the terminals, and the terminals provided on the back surface of the surface having the IC chip have curved convex faces, and the ground terminal has curved concave faces each of which is a counter face positioned opposite to each of the curved convex faces of the terminals so that there is the constant gap (gap a) between the curved convex face and each of the curved concave faces, and the gap (gap a) between the ground terminal and each of the terminals is narrower than a gap (gap b) between all the terminals other than the ground terminal provided on the back surface of the surface having the IC chip.

Therefore, in case where static electricity is applied to the terminal provided on the substrate so as to be positioned on the back surface of the surface having the IC chip and the surge discharge occurs from the terminal to which the static electricity has been applied, it is possible to discharge the surge discharge (electric arc) component from the terminals other than the ground terminal, via a discharge path of the gap a in which electric fields are most likely to gather, toward the ground terminal. Thus, it is possible to prevent the occurrence of the surge discharge between the terminals other than the ground terminal, thereby protecting the IC chip from the static electricity and the surge discharge.

Further, in this case, each of the terminals, provided on the substrate so as to be positioned on the back surface of the surface having the IC chip, which are terminals other than the ground terminal, has the curved convex face, and the counter face provided on the ground terminal so as to be opposite to the other terminals has the curved concave face which is opposite to the curved convex face of the ground terminal with a constant gap therebetween, so that it is possible to surely transmit the surge discharge component which occurs in the terminal sending the surge discharge component to the ground terminal receiving the surge discharge component, and it is possible to alleviate or prevent local gathering of electric fields which is caused by the static electricity. As a result, it is possible to suppress, favorably, prevent damage (breakage) of the terminals which is caused by the surge discharge component discharged from the terminals other than the ground terminal to the ground terminal.

Further, according to the arrangement, not only the terminal sending the surge discharge component (that is, each of the terminals other than the ground terminal) but also the terminal receiving the surge discharge component (that is, the ground terminal) has a curved face. Thus, even in case where the IC card is bent under such condition that the IC module is mounted on the IC card, a stress caused by the bending is dispersed, so that it is possible to prevent breakage (damage) of the IC chip.

Therefore, according to the arrangement, it is possible to surely transmit the surge discharge component as preparation against the ESD, and it is possible to give the IC card the high strength with respect to the bending in the case where the IC module is mounted on the IC card.

Further, as apparent from comparison with the conventional module structure, the IC card according to the present invention has an extremely simple structure, so that it is possible to easily manufacture the IC card at lower cost.

Thus, according to the arrangement, it is possible to provide the IC module which enables the IC card's strength with respect to bending to be secured, and facilitates process thereof, and enables the IC chip to be protected from static electricity.

In order to achieve the foregoing object, the IC module according to the present invention includes: an IC chip provided on one surface of a substrate; and a terminal group, constituted of a plurality of terminals adjacent to each other, which is provided on a back surface of the surface having the IC chip, one of the terminals being a ground terminal, other terminals being constituted of a plurality of external connection terminals electrically connected to the IC chip, wherein: a wiring pattern (A), corresponding to the ground terminal, which is formed on the substrate so as to be positioned on the surface having the IC chip, and a wiring pattern (B), electrically connected to the terminals other than the ground terminal, which is formed on the substrate so as to be positioned on the surface having the IC chip, are disposed locally close to each other, said terminals and said ground terminal being provided on the substrate so as to be positioned on the back surface of the surface having the IC chip.

According to the arrangement, in the substrate, it is possible to secure the discharge path of the surge discharge on the surface having the IC chip. Thus, according to the arrangement, in the gap between both the wiring patterns (A) and (B), it is possible to surely transmit the surge discharge component caused by the static electricity which occurs in the terminal sending the surge discharge component, from the terminal sending the surge discharge component, via the wiring pattern (B), to the wiring pattern (A) corresponding to the ground terminal. Thus, it is possible to protect the IC chip from the static electricity and the surge discharge component.

Further, in order to achieve the foregoing object, the IC card according to the present invention includes the IC module according to the present invention.

According to the arrangement, the IC card according to the present invention includes the foregoing IC module, so that it is possible to provide the IC card which enables the IC card's strength with respect to bending to be secured, and facilitates process thereof, and enables the IC chip to be protected from the static electricity.

For a fuller understanding of the nature and advantages of the invention, reference should be made to the ensuing detailed description taken in conjunction with the accompanying drawings.

DESCRIPTION OF THE EMBODIMENTS

[Embodiment 1]

The following description explains one embodiment of the present invention with reference to FIGS. 1 to 5, FIG. 9, FIG. 10, and FIGS. 14 to 18. Note that, for convenience in description, the same reference signs are given to components having the same functions as components of the conventional IC module, and description thereof is omitted. Note that, the following embodiment explains a case where the IC module is provided on an IC card as an example, but the present invention is not limited to this.

Figure 1:
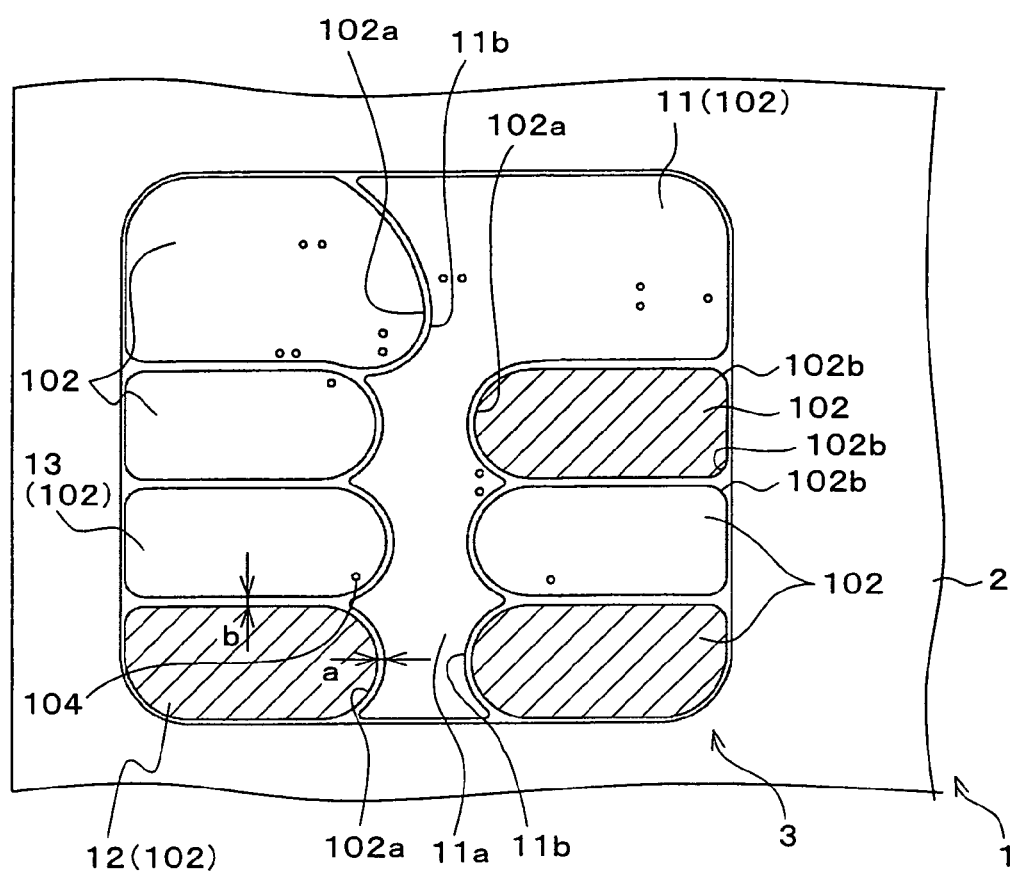
FIG. 1 is a plan view schematically showing an IC module formation portion in an IC card according to one embodiment of the present invention.
Figure 5:
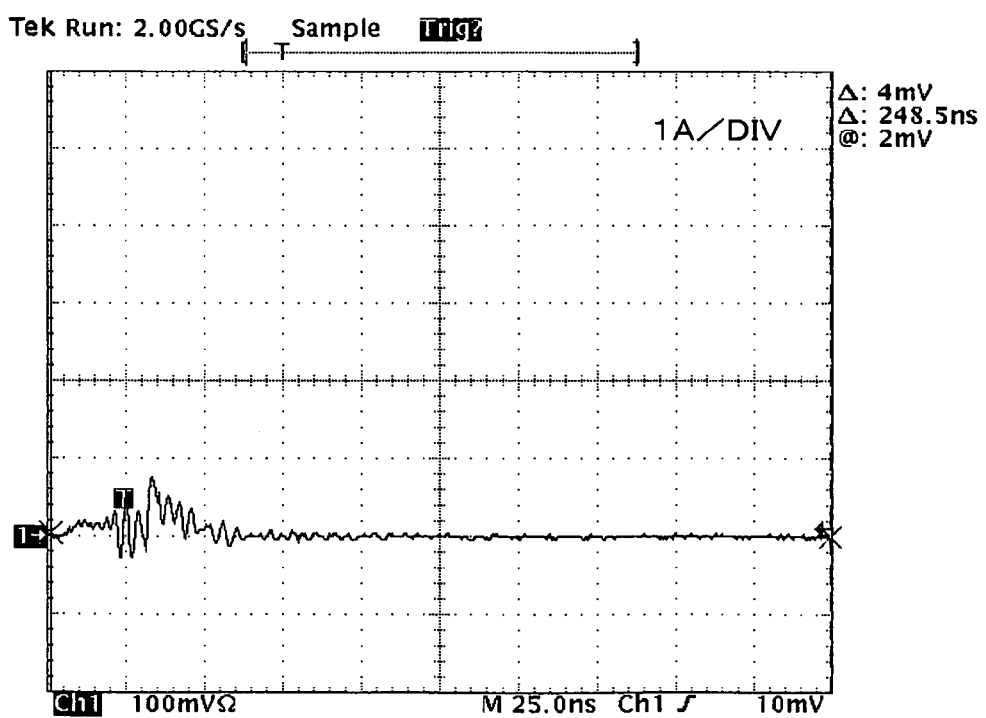
FIG. 5 is a graph showing a current waveform of a surge discharge component discharged toward an input/output contact terminal adjacent to an NC terminal of the IC module according to one embodiment of the present invention in case where electrostatic charge of +2 kV is applied to the NC terminal.
Figure 14:
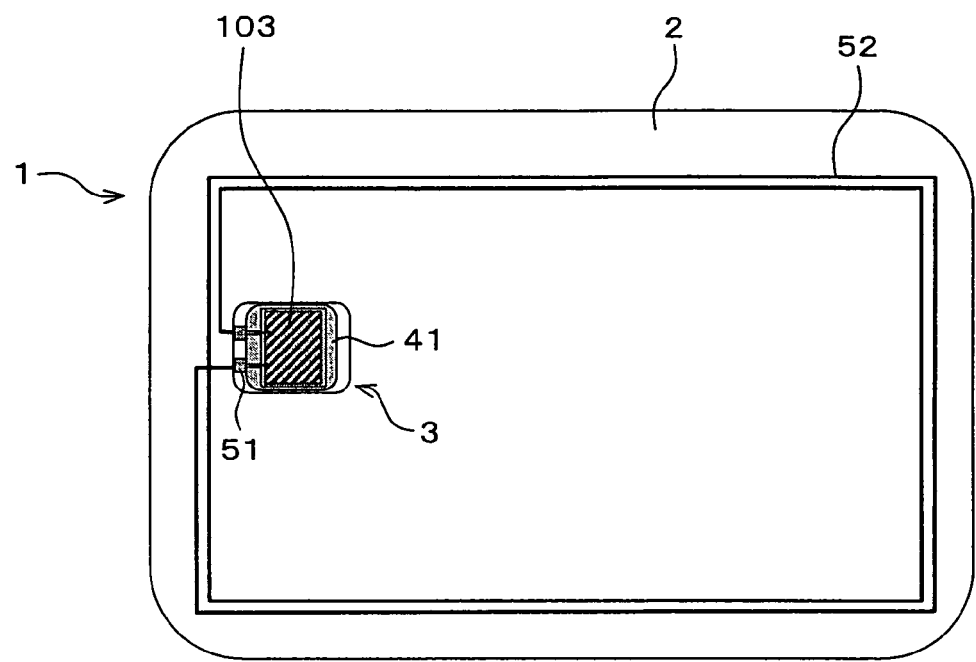
FIG. 14 is a plan view schematically showing an arrangement of an IC card according to one embodiment of the present invention.

FIG. 1 schematically shows an arrangement of an IC module formation portion of the IC card according to the present embodiment. Further, FIG. 14 schematically shows an arrangement of the IC card according to the present embodiment. FIG. 5 schematically shows an important portion of the IC card shown in FIG. 14. In the present embodiment, a contact type IC card is described as an example of the IC card, but arrangements of the IC module and the IC card according to the present embodiment are not limited to this.

Figure 15:
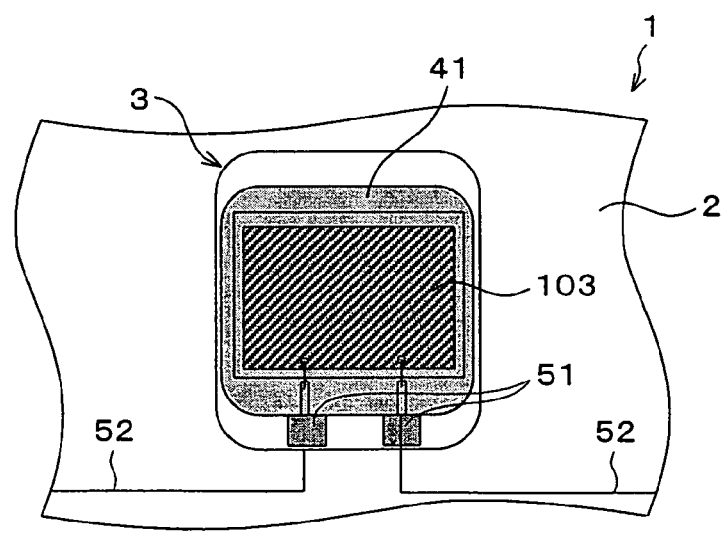
FIG. 15 is a plan view schematically showing an arrangement of an important portion of the IC card shown in FIG. 14.

As shown in FIG. 14, the IC card according to the present embodiment is arranged so that an IC module 3 according to the present embodiment is provided on an end portion of a surface of a card main unit 2 constituted of an IC card base material for example. As shown in FIG. 14 and FIG. 15, an IC chip 103 sealed with sealing resin 41 is provided on a surface side of the card main unit 2, and an antenna line 52 electrically connected to the IC chip 103 via an antenna module terminal 51 is provided along a peripheral portion of the card main unit 2 for example.

Figure 9:
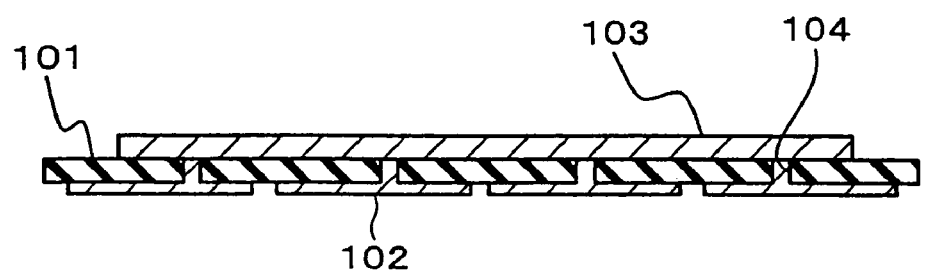
FIG. 9 is a cross sectional view schematically showing a general IC module.

A schematic arrangement of a cross sectional portion of the IC module 3 according to the present embodiment is the same as conventional ones. As shown in FIG. 9, a terminal group constituted of a plurality of contact terminals 102 (terminals (T)) disposed adjacent to each other is provided on one surface of the IC module 3 via an insulating support substrate 101 (substrate such as a print wiring substrate), and the IC chip 103 is provided on the other surface of the IC module 3.

Each of the contact terminals 102 is formed as follows. Both surfaces of the insulating support substrate 101, such as a print wiring substrate, which is provided with copper foils, are respectively patterned by etching the copper foils, and through holes each of which electrically connects the patterns on both the surfaces to each other are provided as required.

Further, in the present embodiment, (i) a predetermined wiring pattern formed on the insulating support substrate 101 so as to be positioned on the surface having the IC chip 103 and (ii) an electrode pad (terminal pad) provided on the IC chip 103 so as to be used as an input/output terminal of the IC chip 103 are connected to each other in accordance with a packaging technique referred to as flip-chip bonding or a packaging technique referred to as wire bonding in which an extrafine wire made of gold, aluminum, or the like is used, and the contact terminals 102 and the terminal pads disposed on the IC chip 103 are correspondingly connected to each other via the through holes 104 and the wiring patterns formed on the insulating support substrate 101, so that the contact terminals 102 and the IC chip 103 are electrically connected to each other. Further, an ESD protection circuit such as an electrostatic protection diode is provided on an input/output section of the IC chip 103.

Further, one of the contact terminals 102 . . . (terminal group) provided on the insulating support substrate 101 so as to be positioned on the surface having the IC chip 103 is a terminal (terminal ($T_1$)) referred to as a GND terminal 11, and other contact terminals 102 . . . (terminal group) are constituted of input/output contact terminals 13 (terminals ($T_2$)), electrically connected to the IC chip 103, each of which functions as an external connection terminal capable of external access.

Figure 10:
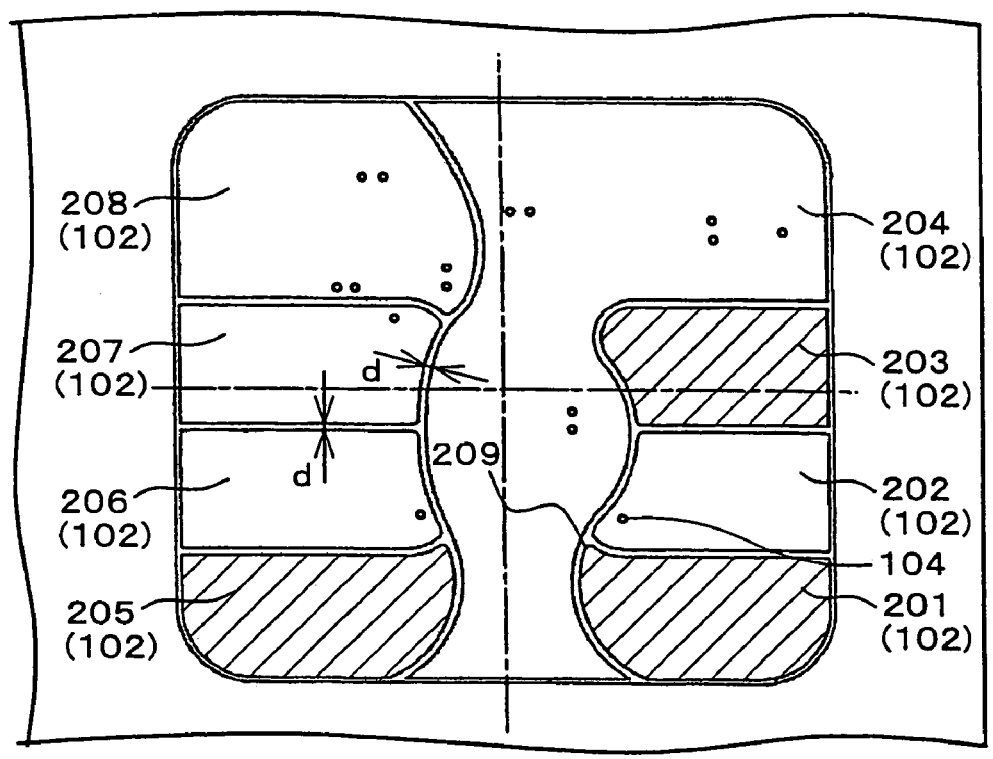
FIG. 10 is a plan view schematically showing a layout in which contact terminals of a module terminal of a non-contact type IC card are disposed in accordance with definition of ISO7816.

A layout of the contact terminals 102 is defined under ISO7816, and each of the contact terminals 102 has a shape different from a shape of each contact terminal 102 shown in FIG. 10. However, as in the IC module shown in FIG. 10, also the IC module 3 according to the present embodiment includes not only the GND terminal 11 used as a reference potential ground terminal, but also: a VCC terminal and a VPP terminal each of which functions as a power source terminal; a CLK terminal which functions as a terminal for inputting a clock; an RST terminal which functions as a terminal for inputting a reset signal; an IO terminal which functions as a data input/output terminal; and an $RFU_0$ terminal and an $RFU_1$ terminal each of which functions as an extension input/output terminal.

Further, the GND terminal 11 of the contact terminals 102 constituting the IC module 3 has an extended portion 11a which extends along a center line of the IC module 3 for example, and a side face 11b of the extended portion 11a, that is, the extended portion 11a's side portion which extends along the center line of the IC module 3 is disposed adjacent to all the other contact terminals 102 with a constant gap a therebetween.

Note that, in the present embodiment, a non-connection terminal (hereinafter, referred to as NC terminal) 12 (terminal $T_{2A}$)) which is electrically disconnected from the IC chip 103 so as to be completely in an electrically floating state is provided on the IC module 3 of the IC card 1 as a reserve terminal (preparatory terminal). However, arrangements of the IC module 3 and the IC card 1 according to the present embodiment are not limited to this. Note that, in FIG. 1, a patterned contact terminal 102 is the NC terminal 12, and contact terminals 102 each of which has one or more through holes 104 are the contact terminals 102 other than the NC terminal 12.

Examples of the NC terminal 12 include: the $RFU_0$ terminal and the $RFU_1$ terminal each of which functions as an extension input/output terminal; the VPP terminal which functions as a data writing power source terminal; and the like, but the NC terminal 12 is not limited to this.

In case where at least one of the contact terminals 102 is the NC terminal 12 which is electrically disconnected from the IC chip 103 so as to be in a completely floating state as the reserve terminal, static electricity applied to the NC terminal 12 is highly likely to be discharged to the input/output terminal 13 adjacent thereto as a surge discharge component. Accordingly, it is so necessary to provide a discharge path of the surge discharge component on the side of the GND terminal 11.

Then, also in the IC module 3 according to the present embodiment, the gap a between the GND terminal 11 and each of the contact terminals 102 other than the GND terminal 11 (that is, the input/output contact terminal 13 and the NC terminal 12 other than the GND terminal 11) is set to be narrower than a gap b between the contact terminals 102 other than the GND terminal 11 (a<b). Note that, in the present invention, a gap between the terminals means a gap between the contact terminals 102 adjacent to each other including the GND terminal 11.

In the present embodiment, it is preferable that the gap a between the GND terminal 11 and each of the contact terminals 102 other than the GND terminal 11 is 50 μm or more and 150 μm or less, and it is preferable that the gap b between the contact terminals 102 other than the GND terminal 11 is 200 μm or more and 540 μm or less.

When the gap a is less than 50 μm, electrical short circuit may occur between the GND terminal 11 and each of the contact terminal 102 other than the GND terminal 11 depending on accuracy in the process. That is, in order to secure an insulating resistance of $10 \times 10^{12}$ Ω or more between the GND terminal 11 and each of the contact terminals 102 other than the GND terminal 11 by patterning a print substrate used in the IC chip 103 with high accuracy, it is preferable that the gap a is 50 μm or more, and it is more preferable that the gap a is larger than 100 μm so as to facilitate the process. Further, when the gap a exceeds 150 μm, it may be impossible to sufficiently secure the surge discharge path toward the GND terminal 11.

Likewise, when the gap b is less than 200 μm, it may be impossible to sufficiently secure the surge discharge path toward the GND terminal 11. Further, when the gap b exceeds 540 μm, the terminal layout may deviate from the terminal layout defined under ISO7816 depending on accuracy in mounting the IC module on the card main unit 2.

That is, the module terminal of the IC card is defined under ISO7816 as described above, and also a layout of a contact area, referred to as a contactive area, which is provided in the module terminal so as to contact the outside, is defined under ISO7816.

Figure 16:
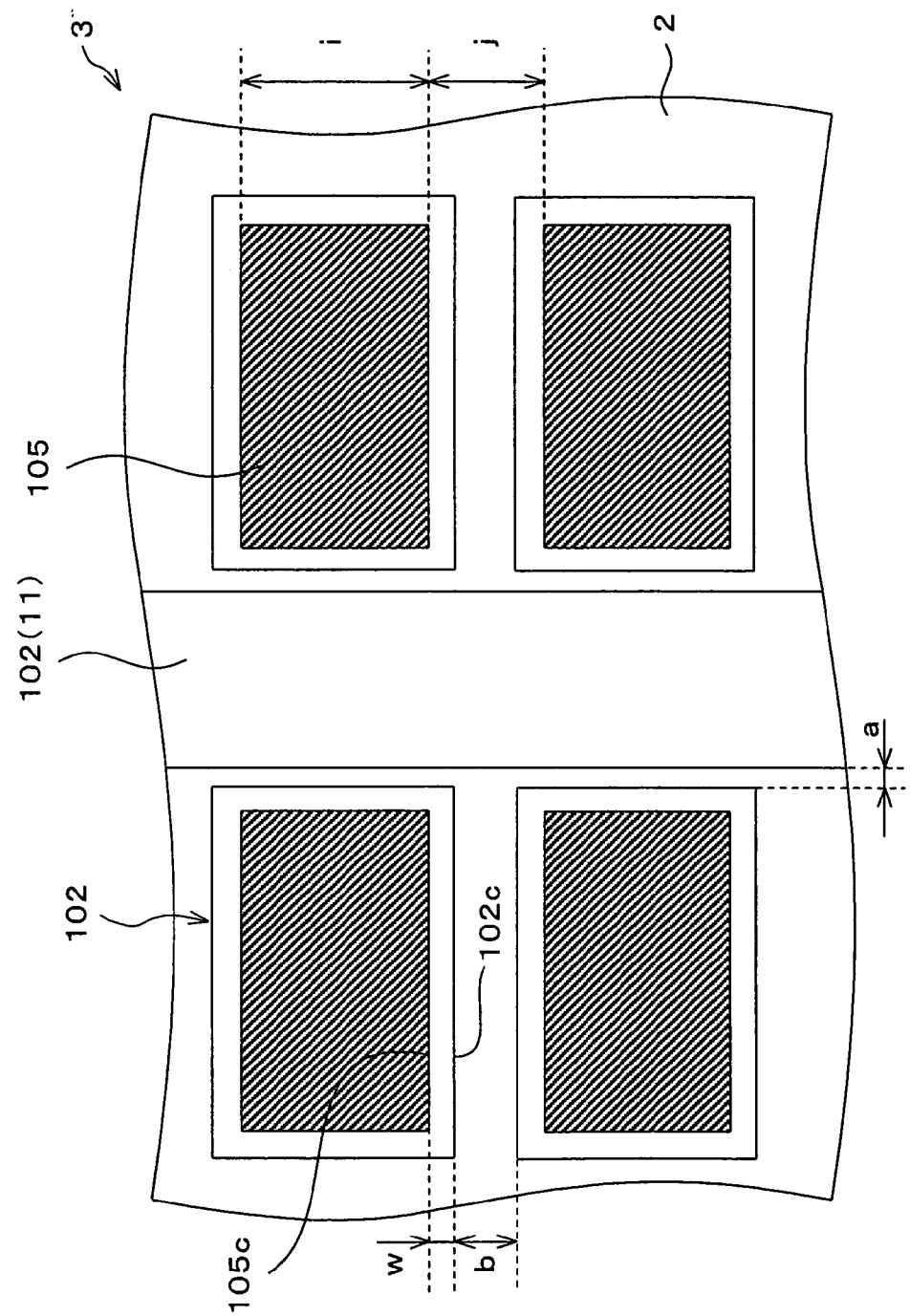
FIG. 16 is an explanatory drawing schematically illustrating how a module terminal pattern and a contactive area of the IC card are related with each other in accordance with definition of ISO7816.

FIG. 16 is an explanatory drawing schematically showing how a module terminal pattern and the contactive area of the IC card are related with each other in accordance with definition of ISO7816.

According to the definition of ISO7816, as shown in FIG. 16, it is necessary that a contactive area 105 is included in an area of the contact terminal 102. Note that, as long as the contact terminal 102 includes the contactive area 105, its pattern shape is not particularly limited. A length of each contactive area 105 in a shorter length direction, that is, a width i of the contactive area 105 in a longer length direction of the GND terminal 11 is 1.7 mm, and a gap j between the contactive areas 105 respectively included in the contact terminals 102 adjacent to each other in the longer length direction of the GND terminal 11 is 0.84 mm.

Generally, a layout of the contactive areas 105 is uniformly defined so that an edge of the IC card (IC card 1 in the present embodiment) is an starting point. Thus, explanation of a scale of a positional relationship thereof is omitted from the following description.

In FIG. 16, a gap between the GND terminal 11 and each of the contact terminals 102 other than the GND terminal 11 is defined as "a", and a gap between the contact terminals 102 other than the GND terminal 11 is defined as "b", and a gap between the contactive area 105 and the module terminal pattern is defined as "w". More specifically, in the contact terminal 102 other than the GND terminal 11, a gap (margin) between (i) an end portion 102c positioned opposite to the contact terminal 102 other than that contact terminal 102 via the gap b and (ii) an end portion 105c included in the contactive area 105 of that contact terminal 102 so as to be positioned opposite to the end portion 102c is defined as "w". When these gaps are defined in this manner, it is necessary that the gap w is 0.15 mm or more in consideration for positional accuracy in mounting the IC module 3 on the card main unit 2.

Thus, a maximum value b(max) of the gap b is as follows.

$$b(\text{max}) = 0.84 \text{ mm} - (0.15 \text{ mm} \times 2) = 0.54 \text{ mm}$$

The gap a and the gap b are set in the foregoing manner, so that static electricity is applied to the contact terminal 102 of the IC module 3. Further, in case where the contact terminal 102 to which the static electricity has been applied causes the surge discharge, it is possible to discharge the surge discharge component from the contact terminal 102 other than the GND terminal 11 to the GND terminal 11 via a discharge path of the gap a which is most likely to gather electric fields. Accordingly, it is possible to prevent the occurrence of the surge discharge between the input/output contact terminal 13 other than the GND terminal 11 and the NC terminal 12, and it is possible to prevent the occurrence of the surge discharge between the input/output contact terminals 13 other than the GND terminal 11, thereby protecting the IC chip 103 from the static electricity and the surge discharge component.

Further, in the IC module 3 according to the present embodiment, as shown in FIG. 1, each of the contact terminals 102 other than the GND terminal 11 has an end portion on the side of the GND terminal 11 so that the end portion has a convex shape curved in a direction of the GND terminal 11.

That is, in the IC module 3 according to the present embodiment, a side face 102a included in each of all the contact terminals 102 other than the GND terminal 11 so as to be positioned opposite to the side face 11b of the extended portion 11a of the GND terminal 11 has a curved convex shape.

The side face 102a provided in each of all the contact terminals 102 other than the GND terminal 11 so as to be positioned opposite to the side face 11b of the extended portion 11a of the GND terminal 11 has the foregoing shape, so that it is possible to surely transmit the surge discharge component (electric arc), which occurs in the contact terminal 102 sending the surge discharge component, to the GND terminal 11 which functions as the contact terminal 102 receiving the surge discharge component, regardless of whether there is the NC terminal 12 or not, and it is possible to alleviate or prevent local gathering of electric fields which is caused by the static electricity, and it is possible to suppress, preferably prevent breakage (damage) of the contact terminal 102 which is caused by the surge discharge component discharged from the contact terminal 102 other than the GND terminal 11 to the GND terminal 11.

Further, in the IC module 3 according to the present embodiment, as shown in FIG. 1, not only the contact terminal 102 sending the surge discharge (electric arc) component (that is, not only the NC terminal 12 and the input/output terminal 13) but also the contact terminal receiving the surge discharge (electric arc) component (that is, but also the GND terminal 11) has a curved face.

In the present embodiment, the side face 11b of the extended portion 11a of the GND terminal 102 opposite to the contact terminal 102 having the curved face is provided so as to have a curved face along that curved face of the contact terminal 102 with a constant gap a therebetween. That is, in the present embodiment, each of all the contact terminals 102 other than the GND terminal 11 has the curved face, and is provided opposite to the GND terminal 11, having a curved concave face, via a space (gap a) narrower than a space (gap b) between the contact terminals 102 other than the GND terminal 11.

Figure 11:
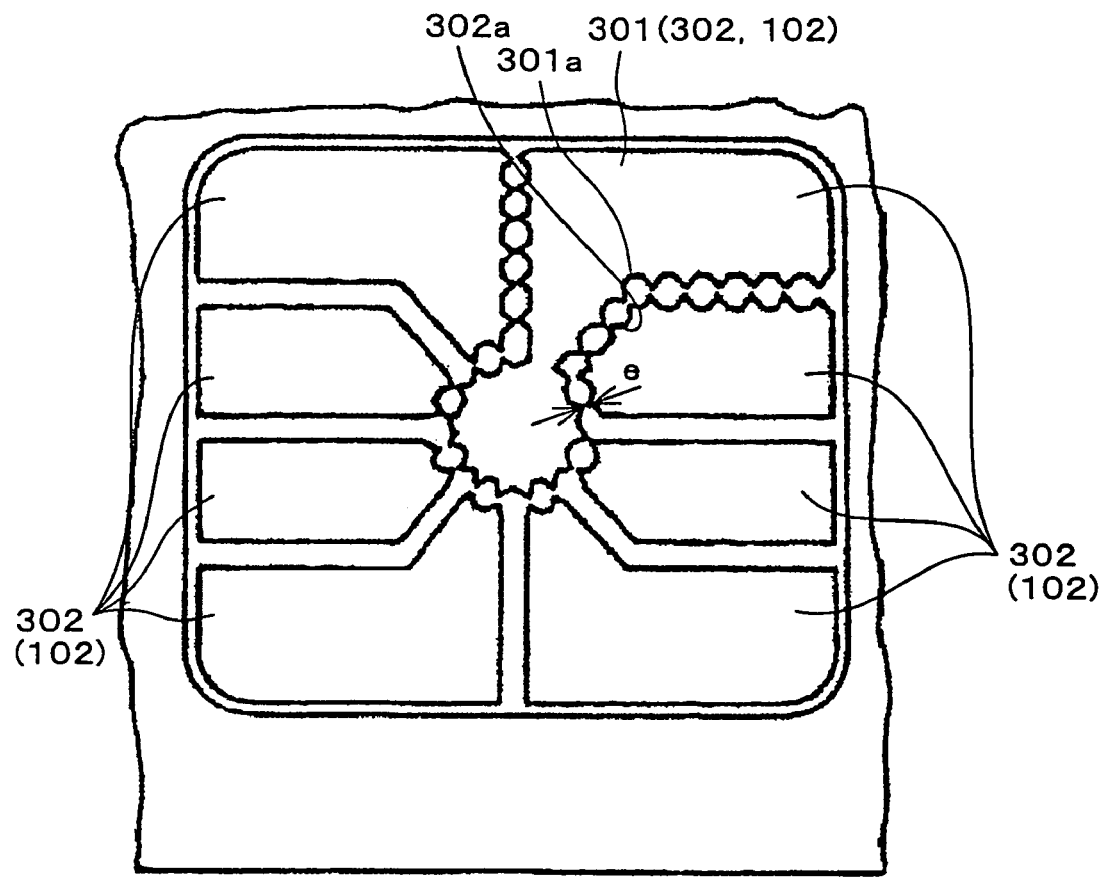
FIG. 11 is a plan view showing an example of a schematic arrangement of an IC module formation portion of an IC card recited in the Patent Document 1.
Figure 12:
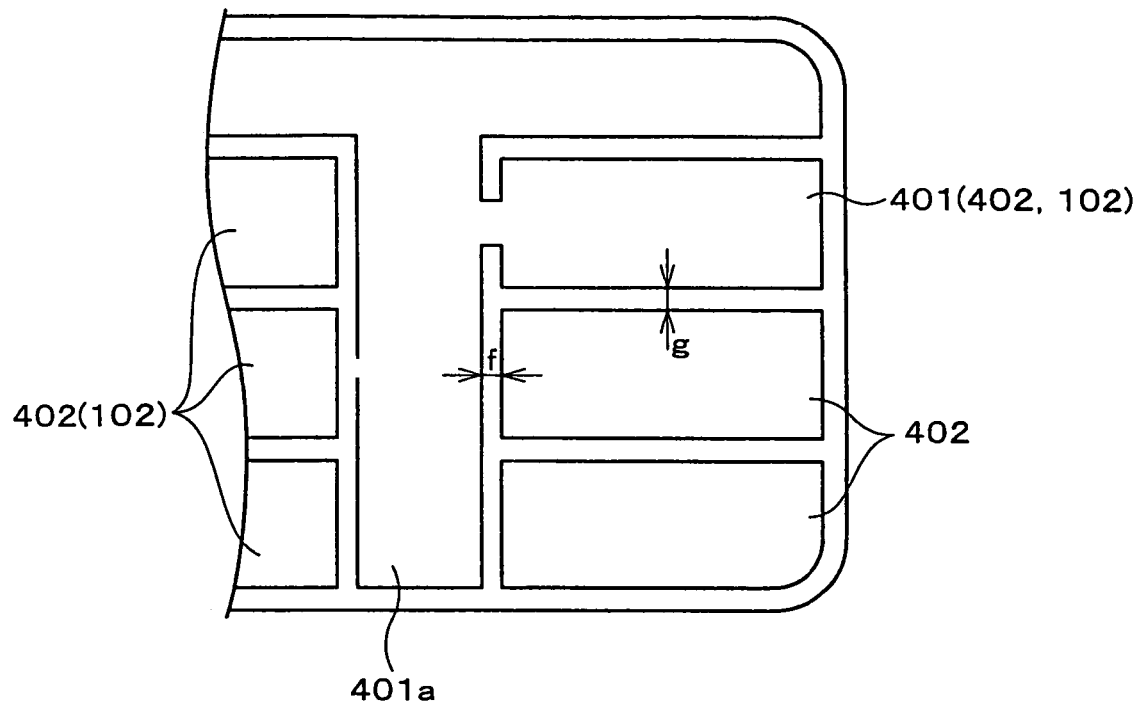
FIG. 12 is a plan view showing an example of a schematic arrangement of an IC module formation portion of an IC card recited in the Patent Document 2.
Figure 13:
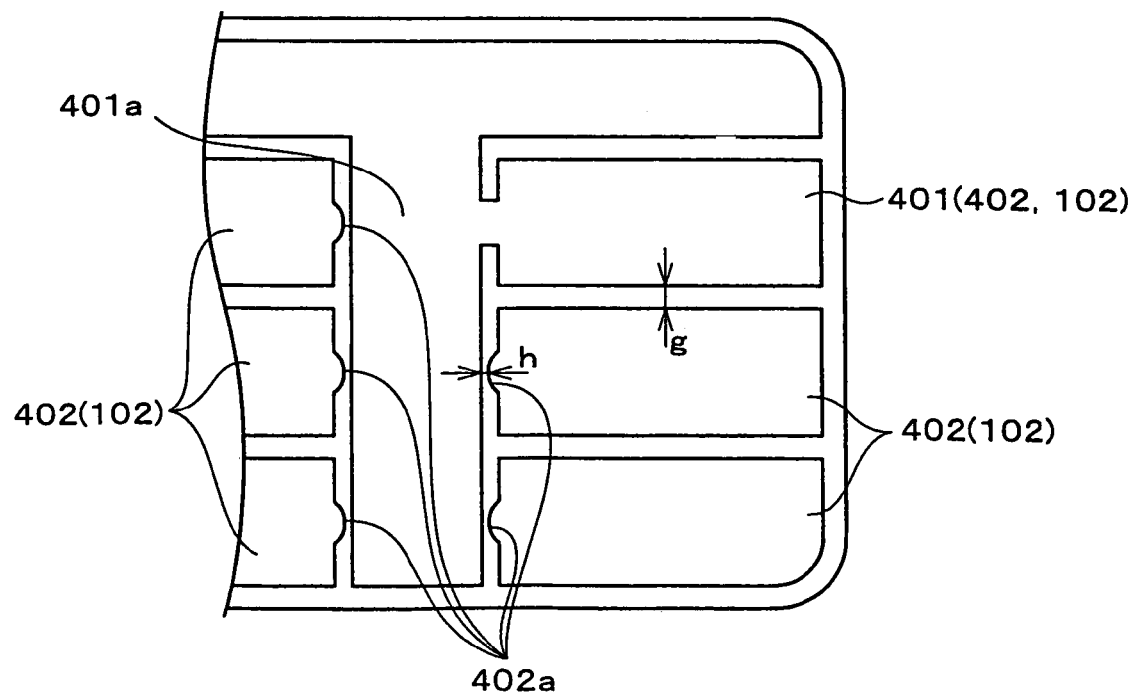
FIG. 13 is a plan view showing another example of the schematic arrangement of the IC module formation portion of the IC card recited in the Patent Document 2.

In this manner, according to the present embodiment, there is a wide adjacent area between the GND terminal 11 and each of other contact terminals 102, so that it is possible to alleviate or prevent gathering of electrostatic charge compared with conventional ones. Thus, it is possible to further reduce damage of the contact terminal in a case where the surge discharge occurs, compared with a conventional IC card, for example, compared with the module structure (see FIG. 11) recited in the Patent Document 1.

Further, the GND terminal 11 and a metal pattern of a face opposite to each of other contact terminals 102 have the curved surfaces. Thus, even when the IC card is bent, a stress exerted by bending the IC card is distributed, thereby preventing the IC chip 103 from being broken (damaged).

Thus, in the IC module 3 according to the present embodiment, it is possible to surely transmit the surge discharge component as preparation against the ESD, and it is possible to realize higher bent strength in the IC card 1 than in a case where the metal pattern is formed merely in a straight shape. Further, as apparent from comparison with the conventional module structure shown in FIG. 11, the IC module 3 according to the present embodiment has an extremely simple structure, so that it is easy to manufacture the IC module 3.

When the curved convex face of the contact terminal 102, that is, a counter face (side face 102a) included in the contact terminal 102 sending the surge discharge component so as to be positioned opposite to the extended portion 11a of the GND terminal 11 of the contact terminal 102 other than the GND terminal 11 has a more semicircular shape, its strength with respect to the bending is enhanced. Accordingly, it is preferable to form the curved convex face in a semicircular shape.

Further, the strength with respect to the bending is enhanced when the gap a is smaller, in other words, when an overlapping area q in which the curved convex face (convex pattern) and the curved concave face (concave pattern) of the GND terminal 11 overlap each other is larger.

In case of forming the curved convex face in a semicircular shape, a curvature radius (R) of the curved convex face is determined in accordance with the gap b and the terminal layout defined under ISO7816, specifically, in accordance with a layout of the contactive areas 105, and the curvature radius (R) is set within a range of 1.00 mm or more and 1.19 mm or less in accordance with the gap b.

Figure 17:
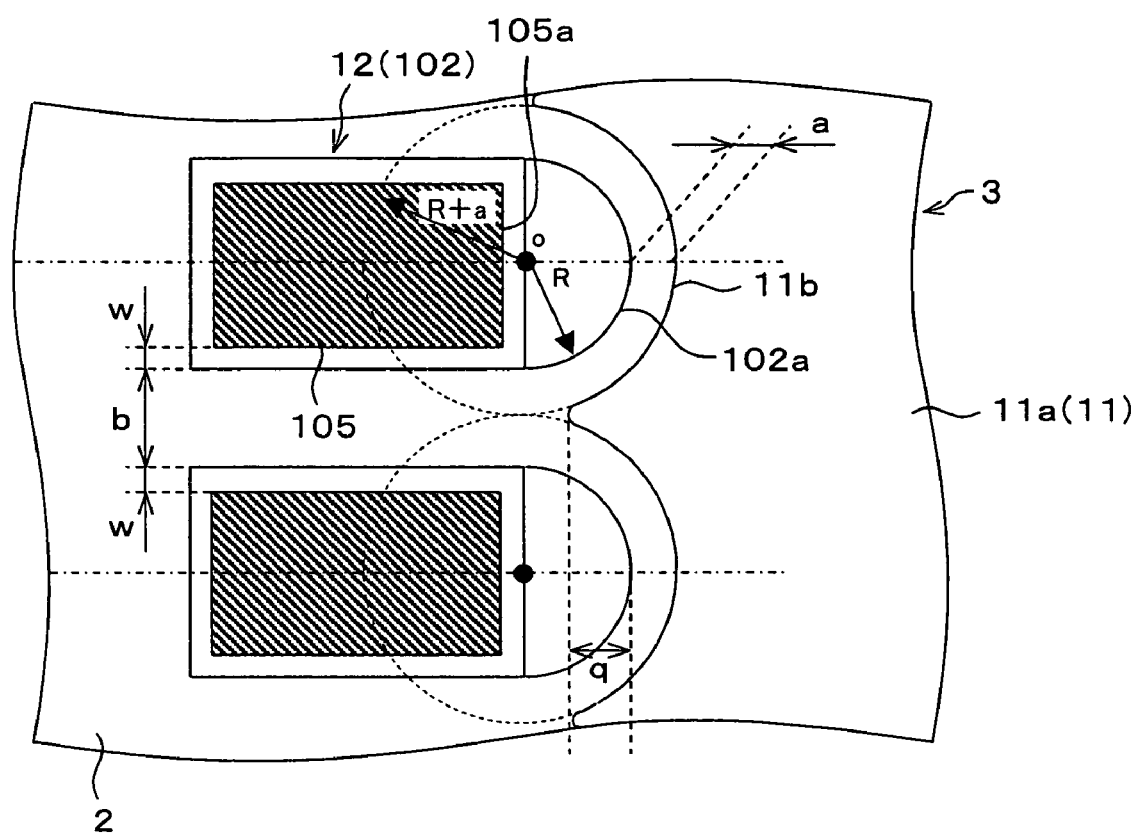
FIG. 17 is a plan view schematically showing an arrangement of an important portion of the IC module according to one embodiment of the present invention in case where a curved convex face of the contact terminal other than the GND terminal has a semicircular shape.

FIG. 17 schematically shows an important portion of the IC module 3 in case where the convex pattern opposite to the extended portion of the GND terminal has a semicircular shape in the contact terminal other than the GND terminal.

As described above, it is preferable to set the gap b within such a range that 200 µm≦b≦540 µm. On the other hand, it is necessary to set the gap w (margin) so that w=340 µm in the case where the gap b is 200 µm, and it is necessary to set the gap w so that w=150 µm in the case where the gap b is 540 µm.

Thus, the curvature radius (R) of the convex pattern is 1.0 mm≦R≦1.19 mm in accordance with the following calculation (measure: mm).

$$\{1.7+(0.15\times2)\}/2 \leq R \leq \{1.7+(0.34\times2)\}/2$$

However, a center point ○ of the convex pattern constituting the curved convex face is positioned at a center of a shorter side, out of four sides of the contact terminal 102 other than the GND terminal 11, which is positioned on the side of the GND terminal 11 without any convex pattern. That is, the center point ○ is positioned at a line extending along a longer length direction of the contactive area 105 via a center of the contactive area 105. Further, the center point ○ is positioned away from a center of an end portion 105a, included in the contactive area 105 so as to be positioned on the side of the GND terminal 11, by a distance equal to the gap w.

Figure 18:
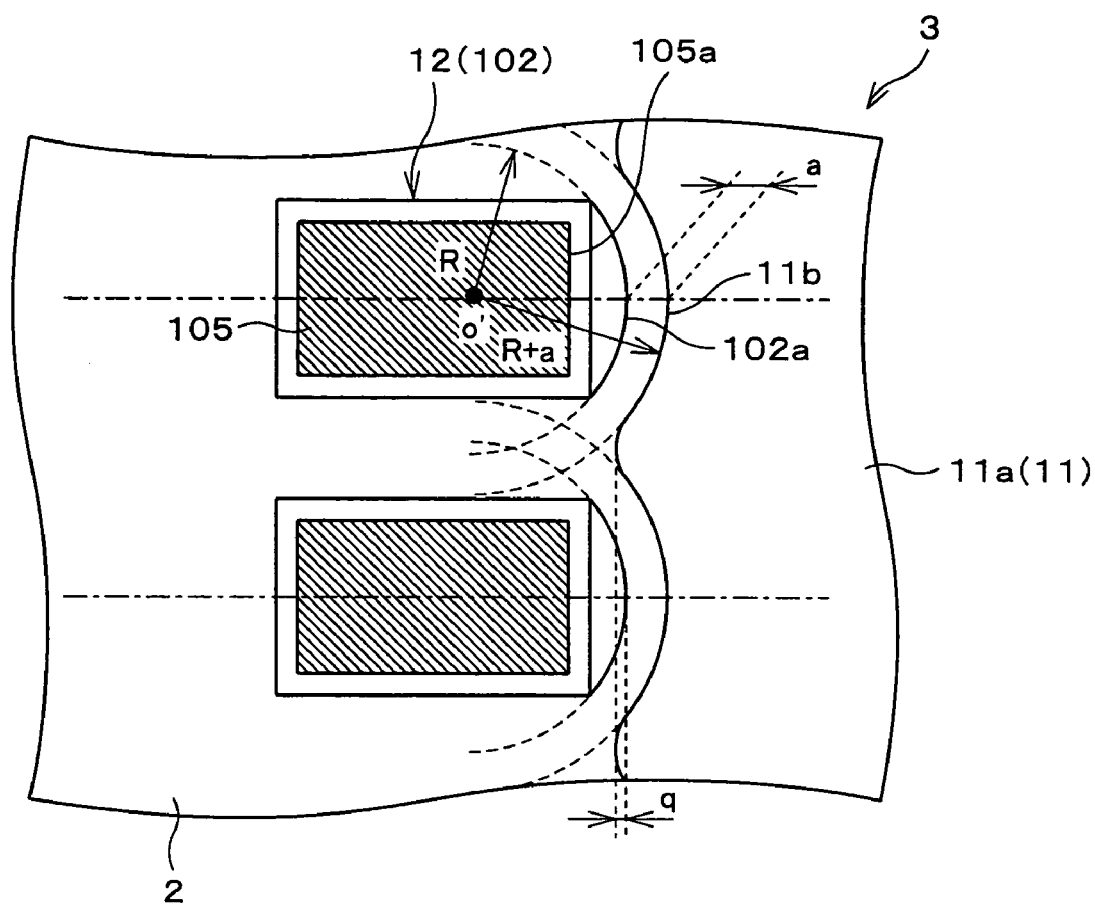
FIG. 18 is a plan view schematically showing an arrangement of an important portion of the IC module according to one embodiment of the present invention in case where the curved convex face of the contact terminal other than the GND terminal does not have the semicircular shape.

Meanwhile, FIG. 18 schematically shows an important portion of the IC module 3 in case where the convex pattern opposite to the GND terminal has a non-semicircular shape in the contact terminal other than the GND terminal.

Each of FIG. 17 and FIG. 18 shows a condition under which there is no overlapping area where the convex pattern of the contact terminal 102 other than the GND terminal 11 overlaps the concave pattern of the GND terminal 11 (that is, the overlapping area q defined by a distance between (i) a line connecting tangent lines of the curved convex face of each of the contact terminals 102, disposed adjacent to each other, which are terminals other than the GND terminal, and (ii) a line which connects starting points of the curved concave face opposite to the curved convex face and overlaps the curved convex face). The condition is referred to as "there is a continuous curve". When there is the continuous curve in this manner, a stress exerted to this portion (continuous curve) is not alleviated, so that the module may be broken along the curve.

Thus, in order to avoid the stress in practical use, it is preferable that the overlapping area q satisfies such condition that q≧500 µm. Thus, in the case where the convex pattern of the contact terminal 102 other than the GND terminal 11 has a non-semicircular shape, when the gap a satisfies the aforementioned range (a<b, preferably, 50 µm≦a≦150 µm, preferably 100 µm or more in terms of processability) and q≧500 µm, it is possible to arbitrarily set a curvature radius (R) of the convex pattern (curved convex face) and its center point ○'. Note that, the center point ○' is positioned at a line extending along a longer length direction of the contactive area 105 via a center of the contactive area 105, and corresponds to a center point of a circle whose arc passes through both corners (both corner portions) of a shorter side, included in the contact terminal 102 other than the GND terminal 11 without the concave pattern so as to be positioned on the side of the GND terminal 11. Further, an upper limit of the overlapping area q is defined within such range that: the line (shown by a broken line in FIG. 18) connecting the starting points of the curved concave face of the ground terminal 11 overlaps the curved convex face of the contact terminal 102 other than the ground terminal 11.

More specifically, the counter face (convex pattern), shown in FIG. 18, which is disposed opposite to the ground terminal 11 of the contact terminal 102 other than the ground terminal 11, is formed in an arc shape, having the center point o' positioned at the line extending via the center of the contactive area 105 of the contact terminal 102 other than the ground terminal 11, which passes through points positioned away from the corner portions included in the contactive area 102 so as to be positioned on the side of the ground terminal 11, by a distance equal to the margin. Moreover, the concave pattern is formed so that: the line disposed opposite to the curved convex face so as to connect the starting points of the curved concave face of the ground terminal 11 overlaps the curved convex face of the contact terminal 102 other than the ground terminal 11.

Further, it is preferable to arrange the IC module 3 so that: in each contact terminal 102, pattern edges 102b of corner portions which are adjacent to each other so as to be along a peripheral portion (module peripheral portion) of the IC module 3 are curved (that is, outside corner portions of each contact terminal 102 are curved).

The outside corner portions (edges) of the contact terminal 102 are curved, so that it is possible to prevent the surge discharge of the contact terminals 102 from occurring in this portion, and it is possible to more surely form the discharge path of the surge discharge component on the side of the GND terminal 11. In this case, in order to suppress the gathering of electric fields in the pattern edge 102b, it is preferable to set the curvature radius (R) of the pattern edge 102b to be 500 µm or more. Note that, an upper limit of the curvature radius (R) is defined within a range satisfying the foregoing condition.

The following description shows (i) a result obtained by observing a waveform of a surge discharge current component of the IC module 3, having a protection structure according to the present embodiment, on the basis of HBM evaluation and (ii) a waveform of a surge discharge current component of a conventional IC module shown in FIG. 10.

Figure 2:
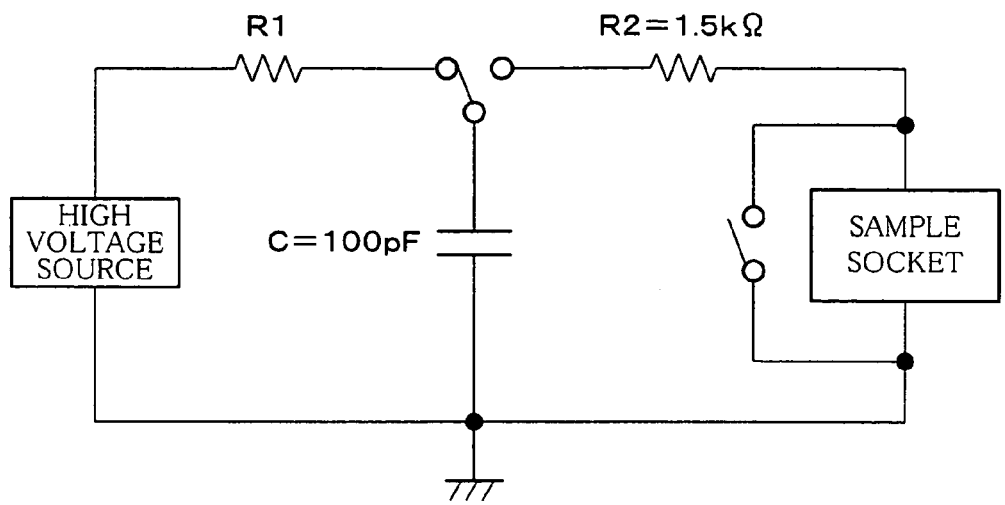
FIG. 2 is an equivalent circuit of an evaluation apparatus used in an HBM evaluation which is one of general methods for evaluating a withstand electrostatic voltage strength of the IC chip.

FIG. 2 shows an equivalent circuit of an evaluation apparatus used in the HBM evaluation (withstand electrostatic voltage strength evaluation) which is a general method for evaluating withstand electrostatic voltage strength of the IC chip 103.

The evaluation apparatus shown in FIG. 2 includes a charging circuit and a discharging circuit, and is arranged as follows: First, the charging circuit causes a high voltage power source to store electric charge in a capacitor via a resistor R1, and a circuit switch causes the charging circuit to be switched to the discharging circuit, and the discharging circuit applies the electric charge stored in the capacitor to an evaluation sample, provided in a sample socket, via a series resistor (R2), by means of a module socket application pin.

Figure 3:
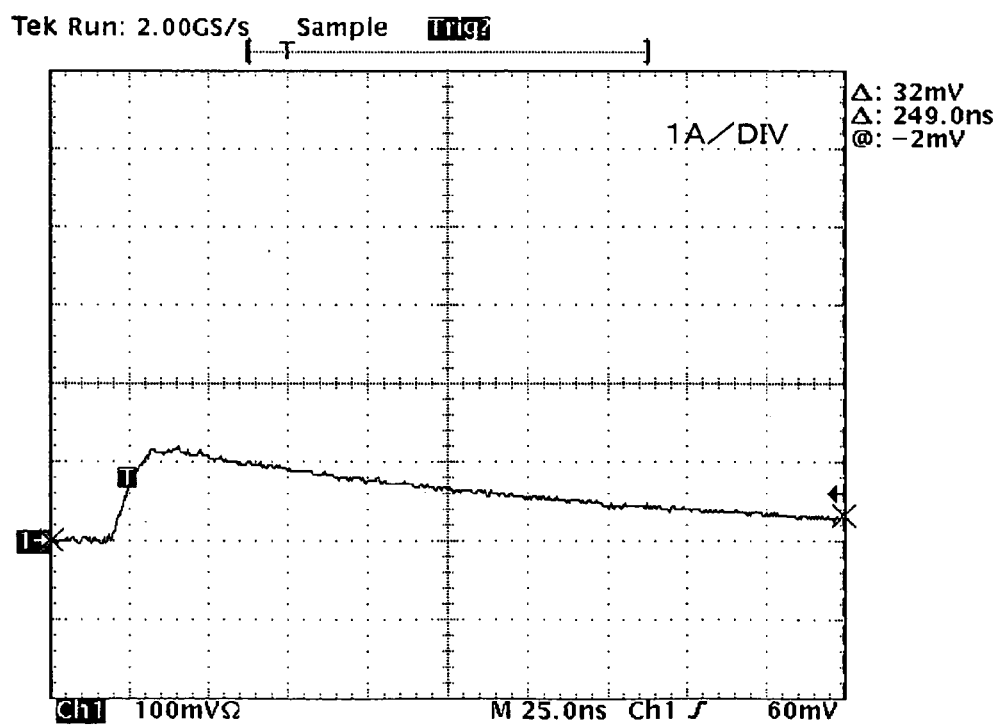
FIG. 3 is a graph showing a current waveform in case where an electrostatic charge of +2 kV charged in the circuit of FIG. 2 so that its capacitance is 100 pF is applied to an evaluation sample via a resistor of 1.5 kΩ.

Further, FIG. 3 shows a current waveform in case where an electrostatic charge of +2 kV charged in the circuit of FIG. 2 so that its capacitance is 100 pF is applied to the module socket application pin via the series resistor (R2) of 1.5 kΩ. Note that, FIG. 3 shows a waveform in directly observing an ESD stress, outputted from the circuit (application apparatus) to the module socket application pin, by means of a synchroscope via a current probe, without using the sample (module).

Figure 4:
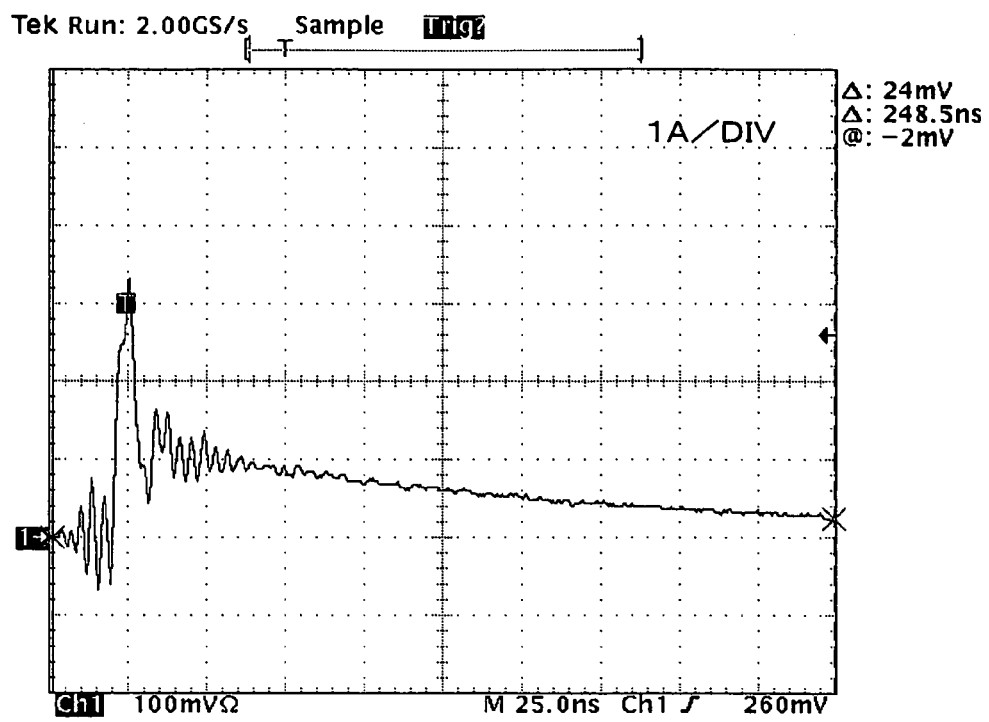
FIG. 4 is a graph showing a current waveform of a surge discharge component discharged toward an input/output contact terminal adjacent to an NC terminal of a conventional IC module in case where electrostatic charge of +2 kV is applied to the NC terminal.

Further, FIG. 4 shows a current waveform of a surge discharge component discharged toward the input/output contact terminal adjacent to the NC terminal in case where the electrostatic charge of +2 kV is applied to the NC terminal of the conventional IC module shown in FIG. 10. Note that, FIG. 4 shows a waveform in directly observing a surge component, discharged to the adjacent input/output contact terminal due to the ESD stress applied from the circuit (application apparatus) to the NC terminal of the evaluation sample (module) via the module socket application pin, by means of a synchroscope via a current probe as in FIG. 3. Note that, a distance between an end of a protruding pattern of the NC terminal of the conventional IC module shown in FIG. 10 and the adjacent input/output contact terminal is set to be 150 µm.

Note that, observation (evaluation) of a waveform of the surge discharge current component in the HBM evaluation (withstand electrostatic voltage strength evaluation test) of the present embodiment was performed under the following condition.

Evaluation Apparatus: "HED-S5000" (product name: made by Hanwa Electronic Ind. Co., Ltd.)

Evaluation Circumstance:
  Temperature, 25±5° C.
  Humidity, 60±10% RH
  Capacitance, 100 pF±5% (see FIG. 2)
  Series Resistance (R2), 1.5 kΩ±5% (see FIG. 2)

Evaluation Condition: in terms of GND terminal, + electric charge was applied
  (the GND terminal was grounded, and the electrostatic charge was applied to the NC terminal)

A result of the observation was as follows. As shown in FIG. 3, a peak current component of general HBM electrostatic strength (+2 kV) was approximately 1A. On the other hand, as shown in FIG. 4, a peak current component of a surge discharge component discharged toward the input/output contact terminal adjacent to the NC terminal was approximately 3A. Comparing both the waveforms with rise times thereof taken into consideration, it is apparent that an impulse current component of the surge discharge component greatly influences the IC chip 103.

Further, FIG. 5 is a graph showing a current waveform of the surge discharge component discharged toward the input/output contact terminal 13 adjacent to the NC terminal 12 in case where the electrostatic charge of +2 kV is applied to the IC module 3 having the protection structure according to the present embodiment as in the aforementioned HBM evaluation. Also FIG. 5 shows a waveform in directly observing a surge component, discharged toward the adjacent input/output contact terminal 13 due to the ESD stress applied from the circuit (application apparatus) to the NC terminal of the evaluation sample (module) via the module socket application pin, by means of a synchroscope via a current probe, as in FIG. 4.

A current component of approximately 0.7 A that is shown in FIG. 5 is generated as follows. A high frequency component at a moment of occurrence of the surge discharge from the NC terminal 12 to the GND terminal 11 enters into the side of the input/output contact terminal 13 adjacent to the NC terminal 12 due to capacitance coupling between the contact terminals. As apparent from its current component, there is no influence on the IC chip 103.

The result shows that: according to the IC module 3 of the present embodiment, in case where static electricity is applied to the contact terminal 102 and the surge discharge occurs from the contact terminal 102, it is possible to form the discharge path of the surge discharge component on the side of the GND terminal and it is possible to protect the IC chip 103 from the surge discharge.

Note that, the waveform data described in the aforementioned drawings were obtained by carrying out the test in terms of the GND terminal basis with + application. However, also in case of carrying out the test in terms of the GND terminal basis with − application, and also in case of carrying out the test in terms of the VCC terminal basis (VCC terminal was grounded) with +or − application, it was confirmed that: the ESD strength of the IC module having the protection structure according to the present embodiment was improved compared with the conventional IC module shown in FIG. 10.

[Embodiment 2]

Figure 6:
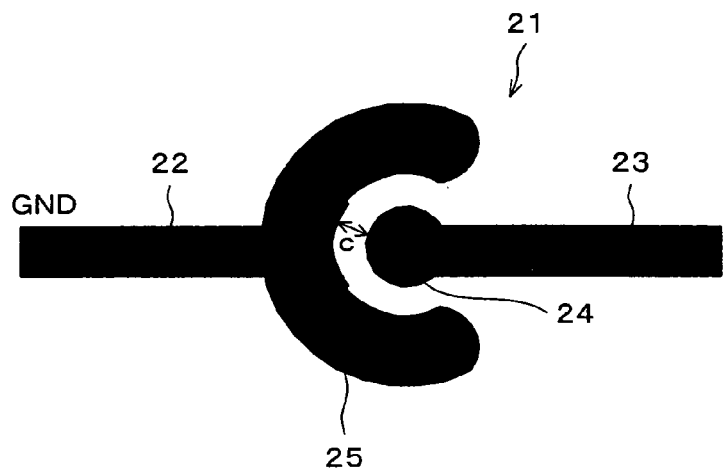
FIG. 6 is a plan view schematically showing a surge discharge pattern, protecting the IC chip from static electricity, which is used to provide a surge discharge path on an insulating support substrate so that the surge discharge path is positioned on a surface having the IC chip and on the side of a GND terminal.
Figure 7:
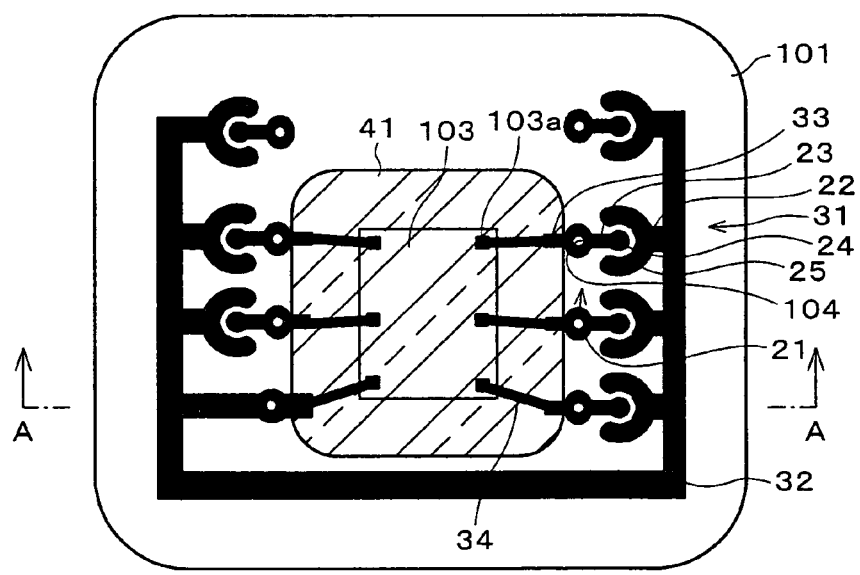
FIG. 7(a) is a plan view schematically showing an arrangement of the surface, included in the insulating support substrate of the IC module using the surge discharge pattern of FIG. 6, on which the IC chip is provided.
FIG. 7(b) is a cross sectional view taken along A—A of the IC module shown in FIG. 7(a).
Figure 7:
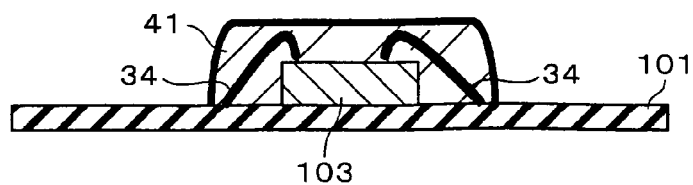
Figure 8:
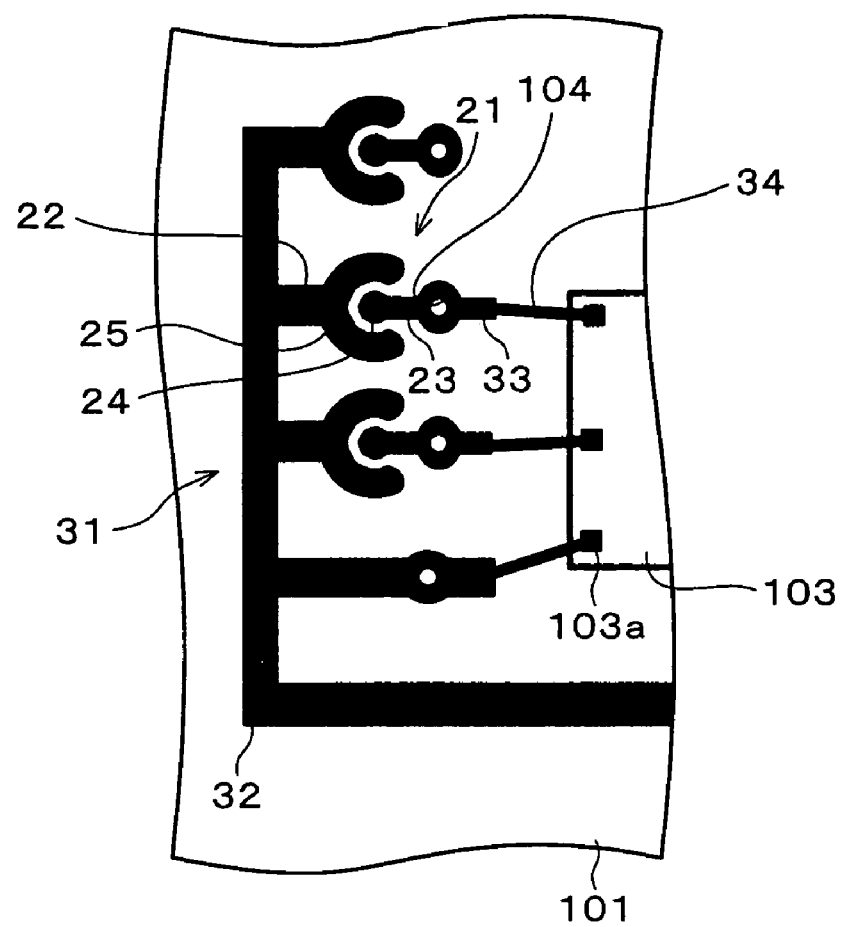
FIG. 8 is a plan view schematically showing an important portion of the surface, included in the insulating support substrate of the IC module shown in FIG. 7(a) and FIG. 7(b), on which the IC chip is provided, under a condition that the insulating support substrate is not sealed with resin.

The following description explains another embodiment of the present invention with reference to mainly FIG. 6 to FIG. 8. The present embodiment explains mainly differences from Embodiment 1. Note that, for convenience in description, the same reference signs are given to components having the same functions as components of the conventional IC module and the IC module according to Embodiment 1, and description thereof is omitted.

Embodiment 1 describes the case of improving a shape of the contact terminal 102, provided on the insulating support substrate 101 so as not to be positioned on a surface having no IC chip 103, so as to improve the strength with respect to the electrostatic discharge (ESD). The present embodiment describes mainly a case of improving a terminal shape of a wiring pattern, provided on the insulating support substrate 101 so as to be positioned on the surface where the IC chip 103 is provided (mounted), so as to improve the strength with respect to the ESD.

FIG. 6 is a plan view schematically showing a surge discharge pattern 21, used to protect the IC chip 103 from static electricity, which is provided on the insulating support substrate 101 so as to be positioned on the surface having the IC chip 103. All the contact terminals 102 including the NC terminal 12 of the IC module 3 are electrically connected (in a conduction state) to a wiring pattern 31, shown in FIG. 7(a) and FIG. 8, which is provided on the insulating support substrate 101 so as to be positioned on the surface having the IC chip 103, via through holes 104. The surge discharge pattern 21 is a pattern for causing the surge discharge on the wiring pattern 31.

FIG. 7(a) is a plan view schematically showing an arrangement of the insulating support substrate 101's surface having the IC chip 103 that is included in the IC module 3 using the surge discharge pattern 21 shown in FIG. 6. FIG. 7(b) is a cross sectional view taken along A—A of the IC module 3 shown in FIG. 7(a). Note that, in FIG. 7(b), the contact terminal 102 provided on the insulating support substrate 101 so as to be positioned on the surface having the IC chip 103 is not shown. Further, FIG. 8 is a plan view schematically showing an important portion of the surface, having the IC chip 103, which is included in the insulating support substrate 101 unsealed with resin in the IC module 3 shown in FIG. 7(a) and FIG. 7(b).

In the present embodiment, as preparation against the ESD, a metal pattern (surge discharge pattern 21) is formed on the insulating support substrate 101's surface having the IC chip 103, which is not seen from a front surface of the IC card 1.

Note that, as an example, the present embodiment describes a case of using a wire-bond-connection-type IC module, in which the IC chip 103 is provided (mounted) on the insulating support substrate 101 by wire bonding as shown in FIG. 7(a), FIG. 7(b) and FIG. 8, as the IC module 3. However, the present embodiment is not limited to this arrangement.

The IC module 3 is arranged as follows. As shown in FIG. 7(a) and FIG. 8, the through holes 104 are provided in the insulating support substrate 101, so that the contact terminals 102 (the input/output contact terminal 13, the GND terminal 11, see FIGS. 1 and 9) formed on one surface of the insulating support substrate 101 and the electrode pads 103a (the input/output terminal, the GND terminal 11) of the IC chip 103 are electrically connected to each other via the through holes 104 and the wiring patterns 31 (the GND signal line 32, the surge discharge pattern 21, the connection wiring pattern 33, and the wire 34) formed on the other surface of the insulating support substrate 101. Note that, in FIG. 7(a) and FIG. 8, a wiring having no surge discharge pattern 21 is a wiring of the GND terminal 11.

The IC chip 103 is bonded to the insulating support substrate 101 with conductive paste or the like (not shown) for example. As shown in FIG. 7(a) and FIG. 7(b), the IC chip 103 and the wire 34 are sealed with sealing resin 41 after wire bonding.

Note that, the IC chip 103 may be arranged as follows. The electrode pad 103a provided on the IC chip 103 and the wiring pattern 31 formed on the insulating support substrate 101 so as to be positioned on the surface having the IC chip 103 are mounted (provided) in accordance with a mounting method referred to as flip-chip bonding.

In the present embodiment, as shown in FIG. 7(a) and FIG. 8, the electrode pad 103a of the IC chip 103 is connected (wire-bonded) to the connection wiring pattern 33 (wiring pattern (B)), extending from the through hole 104, by the wire 34 constituted of an extremely fine wire of gold, aluminum, or the like.

Further, via the through hole 104, the connection wiring pattern 33 is electrically connected (in a conduction state) to the wiring pattern (hereinafter, referred to merely as "contact terminal wiring pattern") 23 (wiring pattern (B)) corresponding to the contact terminals 102 other than the GND terminal 11 of the surge discharge pattern 21, shown in FIG. 6, which protects the IC chip 103 from static electricity. A terminal 24, sending the surge discharge component, which has a curved convex face, is provided on an end of the contact terminal wiring pattern 23. In the present embodiment, the terminal 24 is formed in a circular shape for example, but is not limited to this shape.

Further, the surge discharge pattern 21 is arranged so that: a GND terminal wiring pattern 22 (wiring pattern (A)) extending from the GND signal line 32 (wiring pattern (A)) shown in FIG. 7(a) and FIG. 8 is provided opposite to the terminal 24 having a curved convex face. A terminal 25, receiving the surge discharge component as a terminal on the side of the GND signal line 32, which has a curved concave face, is provided on an end of the GND terminal wiring pattern 22 so as to be positioned close to the terminal 24 having the curved convex face. In the present embodiment, the terminal 25 is formed in a letter shape of C for example, that is, in a hollow-center circular shape (semicircular shape) whose counter portion opposite to the terminal 25 is partially notched.

However, in case where static electricity occurs in the GND terminal 11, when an edge (an opening portion of the C letter for example) exists in the GND terminal wiring pattern 22, there is a possibility that: electric fields gather in the edge, so that the surge discharge is likely to occur with respect to the contact terminal wiring pattern 23 which functions as the input/output terminal wiring. Thus, it is effective to curve (round out) an edge of the GND terminal wiring pattern 22 in reducing the occurrence of the surge discharge which occurs from the GND terminal 11 toward the electrode pad 103a (input/output terminal) of the IC chip 103.

Further, taking into consideration a shape of the discharge pattern disposed opposite to the GND terminal wiring pattern 22 which functions as the GND terminal wiring, that is, taking into consideration durability in case where the surge discharge repeatedly occurs in the terminal 24 of the contact terminal wiring pattern 23, it is more preferable that the terminal 24 of the contact terminal wiring pattern 23 is not in a needle-like shape but in a circular shape.

In this manner, according to the present embodiment, it is so arranged that: as shown in FIG. 6 and FIG. 7(a), in part of the wiring pattern of the surface, included in the insulating support substrate 101, which has the IC chip 103, (i) the GND terminal wiring pattern 22 extending from the GND signal line 32 shown in FIG. 7(a) and FIG. 8 and (ii) the contact terminal wiring pattern 23 are disposed locally close to each other. Thus, it is possible to form the discharge path of the surge discharge component on the surface, included in the insulating support substrate 101, which has the IC chip 103. Thus, according to the present embodiment, in the gap c between both the terminals 24 and 25, it is possible to surely transmit (discharge) the surge discharge component from the terminal 24 sending the surge discharge component toward the terminal 25 on the side of the GND signal line.

Further, also in the present embodiment, as in the contact terminal 102 shown in Embodiment 1, it is so arranged that: as shown in FIG. 6, FIG. 7(a), and FIG. 8, curved patterns, e.g. a curved concave face and a curved convex face are formed in a position where the GND terminal wiring pattern 22 and the contact terminal wiring pattern 23 are close to each other, and the curved concave face and the curved convex face are disposed close to each other so as to be opposite to each other. Particularly, the terminal 25 having the curved concave face which is a terminal on the side of the GND signal line 32 is provided opposite to the terminal 24 having the curved concave face so as to cover the terminal 24 via a predetermined gap (gap c). Thus, it is possible to alleviate the gathering of electric fields, and it is possible to suppress or preferably prevent pattern damage in case where the surge discharge occurs.

The preparation against the ESD in which the surge discharge pattern 21 provided on the insulating support substrate 101 so as to be positioned on the surface having the IC chip 103 is used may be adopted together with the preparation against the ESD in which the contact pattern described in Embodiment 1 is used. Alternatively, the methods may be respectively adopted.

Note that, in case of forming the surge discharge pattern 21 on the IC module 3 having the contact pattern described in Embodiment 1, the surge discharge pattern can assist the contact pattern in protecting the IC chip 103. In this manner, the aforementioned methods are adopted with respect to both the surface having the IC chip 103 and the surface having no IC chip 103 of the insulating support substrate 101, so that it is possible to further improve the ESD protection effect, that is, such effect that the IC chip 103 is protected from static electricity and the surge discharge component.

The gap c between the terminals 24 and 25, that is, the gap c between the GND terminal wiring pattern 22 and the contact terminal wiring pattern 23, that are provided on the insulating support substrate 101 so as to be positioned on the surface having the IC chip 103 with them disposed locally close to each other, is set to be equal to the distance (gap a), described in Embodiment 1, which is positioned between (i) the GND terminal 11 provided on the insulating support substrate 101 so as to be positioned on the surface having the IC chip 103 and (ii) the contact terminal 102 other than the GND terminal 11 (c=a<b: note that, "b" represents a gap between the contact terminals 102 other than the GND terminal 11 provided on the insulating support substrate 101 so as to be positioned on the surface having no IC chip 103).

Meanwhile, in case of using solely the aforementioned method in which the surge discharge pattern 21 is used as the preparation against ESD, it is necessary to cause the surge discharge pattern 21, provided on the insulating support substrate 101 so as to be positioned on the surface having the IC chip 103, to generate the surge discharge before the surge discharge occurs between the contact terminals 102, provided on the insulating support substrate 101 so as to be positioned on the surface having no IC chip 103.

In order to satisfy the necessity, it is necessary that the gap between the GND terminal wiring pattern 22 and the contact terminal wiring pattern 23 that are disposed locally close to each other is set to be narrower than (i) the gap a between the GND terminal 11 provided on the insulating support substrate 101 so as to be positioned on the surface having no IC chip 103 and each contact terminal 102 and (ii) the distance (gap b) between the contact terminals 102 other than the GND terminal 11 (c<a≦b).

Note that, in the case of using solely the method in which the surge discharge pattern 21 is used as the preparation against ESD, a relationship between the gap a and the gap b is substantially free from any limitation since the surge discharge pattern 21 provided on the insulating support substrate 101 so as to be positioned on the surface having the IC chip 103 generates the surge discharge. However, it is preferable to set the relationship to be a<b for fear of damage of the surge discharge pattern 21.

In the case of using solely the method in which the surge discharge pattern 21 is used as the preparation against ESD in this manner, there is little limitation in a shape of the contact terminal 102 provided on the surface of the IC module 3, so that it is possible to realize user-friendly design more freely.

As described in Embodiment 1, thus obtained IC module 3 is bonded to the card main unit 2 with adhesive (not shown) or the like, thereby forming the IC card 1.

As described above, originally, the IC chip itself having the IC card therein includes an ESD protection circuit, such as an electrostatic protection diode, provided on an input/output section of the IC chip 103. However, in the present invention, not the IC chip 103 but the substrate having the IC chip 103, i.e., a metal pattern on the insulating support substrate 101 is improved in terms of a shape thereof, so that the ESD strength is further improved.

Further, according to the present invention, as described above, each contact pattern provided on the IC module 3 or the wiring pattern (print wiring pattern) provided on the insulating support substrate 101 so as to be positioned on the surface having the IC chip 103 is processed, so that it is possible to realize such structure that: the surge discharge is led to the side of the GND terminal 11, further, to the side of the GND terminal 32 via the GND terminal wiring pattern 22, thereby protecting the contact terminal 102 of the IC chip 103 from static electricity. Further, according to the present invention, it is possible to provide the IC module 3 and the IC card 1 each of which facilitates process thereof, or enables the contact terminal 102 provided on the surface of the IC module 3 to be designed more freely, and prevents the terminals 102 from being damaged even in the case where long-running static electricity and the surge discharge occur.

Note that, as an example, each of Embodiments 1 and 2 describes the contact-type IC card as an IC card. However, the arrangements of the IC module and the IC card according to the present invention are not limited to this. It may be so arranged that: a terminal provided on a part of the IC module and an external antenna are electrically connected, thereby realizing a combination-type IC card which has also a function of a non-contact-type IC card. Thus, the IC module according to the present invention can be favorably used as a module on which an IC card for the combination-type IC card is mounted.

Further, other than the case of using the IC module in the IC card, the IC module can be used as follows. For example, the IC module is used as a SIM (Subscribe Identify Module) card inserted into a mobile phone, or is used as an IC chip-integrated storage element referred to as a card-edge type, or in a similar manner. As described above, the IC module can be used for various purposes not as the IC card module, but the IC module is particularly favorably used in portable IC-related products, particularly in the IC card.

As described above, the IC module according to the present invention includes: an IC chip provided on one surface of a substrate (insulating support substrate such as a print wiring substrate); and a terminal group, constituted of a plurality of terminals adjacent to each other, which is provided on a back surface of the surface having the IC chip, one of the terminals being a ground terminal (so-called GND terminal), other terminals being constituted of a plurality of external connection terminals (input/output contact terminal, for example) electrically connected to the IC chip, wherein: the ground terminal is disposed adjacent to each of the terminals (for example, an external connection terminal such as an input/output contact terminal, an NC terminal, such as a preparatory terminal, provided as necessary), provided on the back surface of the surface having the IC chip, so as to have a constant gap (gap a) between the ground terminal and each of the terminals, and the terminals provided on the back surface of the surface having the IC chip have curved convex faces, and the ground terminal has curved concave faces each of which is a counter face positioned opposite to each of the curved convex faces of the terminals so that there is the constant gap (gap a) between the curved convex face and each of the curved concave faces, and the gap (gap a) between the ground terminal and each of the terminals is narrower than a gap (gap b) between all the terminals other than the ground terminal provided on the back surface of the surface having the IC chip.

According to the arrangement, the gap between the ground terminal and each of all the other terminals is narrower than the gap between all the terminals other than the ground terminal that are provided on the substrate so as to be positioned on the back surface of the surface having the IC chip. Thus, in case where static electricity is applied to the terminal provided on the substrate so as to be positioned on the back surface of the surface having the IC chip and the surge discharge occurs from the terminal to which the static electricity has been applied, it is possible to discharge the surge discharge (electric arc) component from the terminals other than the ground terminal, via a discharge path of the gap a in which electric fields are most likely to gather, toward the ground terminal. Thus, it is possible to prevent the occurrence of the surge discharge between the terminals other than the ground terminal, thereby protecting the IC chip from the static electricity and the surge discharge.

Further, in this case, each of the terminals, provided on the substrate so as to be positioned on the back surface of the surface having the IC chip, which are terminals other than the ground terminal, has the curved convex face, and the counter face provided on the ground terminal so as to be opposite to the other terminals has the curved concave face which is opposite to the curved convex face of the ground terminal with a constant gap therebetween, so that it is possible to surely transmit the surge discharge component which occurs in the terminal sending the surge discharge component to the ground terminal receiving the surge discharge component, and it is possible to suppress or prevent local gathering of electric fields that is caused by the static electricity. As a result, it is possible to suppress, favorably, prevent breakage (damage) of the terminals which is caused by the surge discharge component discharged from the terminals other than the ground terminal to the ground terminal.

Further, according to the arrangement, not only the terminal sending the surge discharge component (that is, each of the terminals other than the ground terminal) but also the terminal receiving the surge discharge component (that is, the ground terminal) has a curved face. Thus, even in case where the IC card is bent under such condition that the IC module is mounted on the IC card, a stress caused by the bending is dispersed, so that it is possible to prevent breakage (damage) of the IC chip.

Therefore, according to the arrangement, it is possible to surely transmit the surge discharge component as preparation against ESD, and it is possible to give the IC card the high strength with respect to the bending in the case where the IC module is mounted on the IC card.

Further, as apparent from comparison with the conventional module structure, the IC card according to the present invention has an extremely simple structure, so that it is possible to easily manufacture the IC card at lower cost.

Further, it is preferable to arrange the IC module according to the present invention so that: the terminal group provided on the substrate so as to be positioned on the back surface of the surface having the IC chip includes one or more preparatory terminals (so-called reserve terminal) disconnected from the IC chip.

In case where at least one of the terminals provided on the substrate so as to be positioned on the back surface of the surface having the IC chip is a non-connection terminal, referred to as NC terminal, which is electrically disconnected from the IC chip, static electricity applied to the NC terminal is highly likely to be discharged to the adjacent external connection terminal as a surge discharge component. Accordingly, it is so necessary to provide a discharge path of the surge discharge component on the side of the ground terminal.

According to the arrangement, even in the case where the IC module has the non-connection terminal, it is possible to surely transmit the surge discharge component caused by the static electricity which occurs in the terminal sending the surge discharge component to the ground terminal receiving the surge discharge component. Thus, it is possible to prevent the surge discharge from occurring between the terminals other than the ground terminal, thereby protecting the IC chip from the static electricity and the surge discharge component.

Further, it is preferable to arrange the IC module according to the present invention so that: the gap (gap a) between the ground terminal and each of the terminals (for example, an external connection terminal such as an input/output contact terminal, an NC terminal, such as a preparatory terminal, provided as necessary) that are provided on the substrate so as to be positioned on the back surface of the surface having the IC chip is not less than 50 μm and not more than 150 μm, and the gap (gap b) between the terminals other than the ground terminal is not less than 200 μm and not more than 540 μm.

According to the arrangement, the gap between the terminals is set in the foregoing manner. Thus, in case where static electricity is applied to the terminal provided on the substrate so as to be positioned on the back surface of the surface having the IC chip and the surge discharge occurs from the terminal to which the static electricity has been applied, it is possible to discharge the surge discharge (electric arc) component from the terminals other than the ground terminal, via a discharge path of the gap a in which electric fields are most likely to gather, toward the ground terminal. Thus, it is possible to prevent the occurrence of the surge discharge between the terminals other than the ground terminal, thereby protecting the IC chip from the static electricity and the surge discharge.

Further, it is preferable to arrange the IC module according to the present invention so that: a curvature radius of each of the corner portions of the terminal (T) is not less than 500 μm, said corner portions being disposed adjacent to each other so as to be positioned on the peripheral portion of the IC module.

According to the arrangement, it is possible to prevent the occurrence of the surge discharge which occurs between the corner portions of the terminals, and it is possible to more surely secure the discharge path of the surge discharge component on the side of the ground terminal.

Further, it is preferable to arrange the IC module according to the present invention so that: a wiring pattern (A), corresponding to the ground terminal, which is formed on the substrate so as to be positioned on the surface having the IC chip, and a wiring pattern (B), electrically connected to the terminals other than the ground terminal, which is formed on the substrate so as to be positioned on the surface having the IC chip, are disposed locally close to each other, said terminals and said ground terminal being provided on the substrate so as to be positioned on the back surface of the surface having the IC chip.

According to the arrangement, in the substrate, it is possible to secure the discharge path of the surge discharge on the surface having the IC chip. Thus, according to the arrangement, in the gap (gap c) between both the wiring patterns (A) and (B), it is possible to surely transmit the surge discharge component caused by the static electricity which occurs in the terminal sending the surge discharge component, from the terminal sending the surge discharge component, via the wiring pattern (B), to the wiring pattern (A) corresponding to the ground terminal. Thus, it is possible to protect the IC chip from the static electricity and the surge discharge component.

Further, it is preferable to arrange the IC module according to the present invention so that: a gap (gap c) between the wiring pattern (A) and the wiring pattern (B) is narrower than the gap (gap b) between all the terminals other than the ground terminal that are provided on the substrate so as to be positioned on the back surface of the surface having the IC chip.

According to the arrangement, it is possible to more surely transmit the surge discharge component caused by the static electricity which occurs in the terminal sending the surge discharge component, from the terminal sending the surge discharge component, via the wiring pattern (B), to the wiring pattern (A) corresponding to the ground terminal. Thus, it is possible to more surely protect the IC chip from the static electricity and the surge discharge component.

As described above, the IC module according to the present invention includes: an IC chip provided on one surface of a substrate (insulating support substrate such as a print wiring substrate); and a terminal group, constituted of a plurality of terminals adjacent to each other, which is provided on a back surface of the surface having the IC chip, one of the terminals being a ground terminal (so-called GND terminal), other terminals being constituted of a plurality of external connection terminals (input/output terminal, for example) electrically connected to the IC chip, wherein: a wiring pattern (A), corresponding to the ground terminal, which is formed on the substrate so as to be positioned on the surface having the IC chip, and a wiring pattern (B), electrically connected to the terminals (for example, an external connection terminals such as an input/output contact terminal) other than the ground terminal, which is formed on the substrate so as to be positioned on the surface having the IC chip, are disposed locally close to each other, said terminals and said ground terminal being provided on the substrate so as to be positioned on the back surface of the surface having the IC chip.

According to the arrangement, in the substrate, it is possible to secure the discharge path of the surge discharge on the surface having the IC chip. Thus, according to the arrangement, in the gap (gap c) between both the wiring patterns (A) and (B), it is possible to surely transmit the surge discharge component caused by the static electricity which occurs in the terminal sending the surge discharge component, from the terminal sending the surge discharge component, via the wiring pattern (B), to the wiring pattern (A) corresponding to the ground terminal. Thus, it is possible to protect the IC chip from the static electricity and the surge discharge component.

Further, it is preferable to arrange the IC module according to the present invention so that: the wiring pattern (A) is provided with a terminal section having a curved concave face, and the wiring pattern (B) is provided with a terminal section having a curved convex face, and the wiring pattern (A) and the wiring pattern (B) are disposed close to each other so that the curved convex face of the terminal section and the curved concave face of the terminal section are opposite to each other.

According to the arrangement, it is possible to more surely transmit the surge discharge component caused by the static electricity which occurs in the terminal sending the surge discharge component, from the terminal sending the surge discharge component, via the wiring pattern (B), to the wiring pattern (A) corresponding to the ground terminal, and it is possible to alleviate or prevent local gathering of electric fields which is caused by the static electricity, and it is possible to suppress, preferably prevent breakage (damage) of the terminal which is caused by the surge discharge component.

Further, it is preferable to arrange the IC module according to the present invention so that: a gap between the wiring pattern (A) and the wiring pattern (B) is narrower than the gap (gap a and gap b) between all the terminals that are provided on the substrate so as to be positioned on the back surface of the surface having the IC chip.

According to the arrangement, it is possible to generate the surge discharge between the wiring pattern (A) and the wiring pattern (B) before the surge discharge occurs between the terminals provided on the substrate so as to be positioned on the back surface of the surface having the IC chip, so that it is possible to prepare against the ESD solely by means of the surface having the IC chip in the substrate without depending on a shape of the terminal formed on the substrate so as to be positioned on the back surface of the surface having the IC chip. Thus, according to the arrangement, there is little limitation in a shape of the terminal provided on the surface having the IC module, so that it is possible to realize user-friendly design more freely.

The IC card according to the present invention includes the IC module according to the present invention.

According to the arrangement, the IC card includes the IC module according to the present invention, so that it is possible to provide the IC card which enables the IC card's strength with respect to bending to be secured, and facilitates process thereof, and enables the IC chip to be protected from static electricity.

Further, the present invention is not limited to the aforementioned embodiments, and various modifications thereof are possible. Also, an embodiment obtained by properly combining technical means disclosed in the different embodiments with each other is included in the technical scope of the present invention.

The invention being thus described, it will be obvious that the same way may be varied in many ways. Such variations are not to be regarded as a departure from the spirit and scope of the invention, and all such modifications as would be obvious to one skilled in the art are intended to be included within the scope of the following claims.

What is claimed is:

1. An IC module, comprising:
   an IC chip provided on one surface of a substrate; and
   a terminal group, including a plurality of terminals adjacent to each other, provided on a back surface of the substrate including the IC chip, one of the terminals being a ground terminal and other terminals including a plurality of external connection terminals electrically connected to the IC chip, wherein:
   the ground terminal is disposed adjacent to each of the other terminals, provided on the back surface of the surface having the IC chip, so as to have a constant gap between the ground terminal and each of the other terminals, and
   the other terminals provided on the back surface of the surface having the IC chip include curved convex faces, and the ground terminal includes curved concave faces, each of which is a counter face positioned opposite to each of the curved convex faces of the other terminals so that there is the constant gap between the curved convex face and each of the curved concave faces, and the gap between the ground terminal and each of the other terminals is narrower than a gap between all the other terminals, other than the ground terminal, provided on the back surface of the substrate including the IC chip, wherein the gap between the ground terminal and each of the other terminals provided on the back surface of the substrate is not less than 50 μm and not more than 150 μm, and the gap between the other terminals is not less than 200 μm and not more than 540 μm.

2. The IC module as set forth in claim 1, wherein the terminal group provided on the substrate so as to be positioned on the back surface of the substrate including the IC chip includes one or more preparatory terminals disconnected from the IC chip.

3. The IC module as set forth in claim 1, wherein the counter face provided on each of the other so as to be opposite to the ground terminal is formed in a semicircular shape whose center point is positioned at a line extending via a center of a contactive area of each of the other terminals and is positioned away from a center of an end portion of the contactive area toward the ground terminal by a distance equal to a margin, said end portion being positioned on a side of the ground terminal.

4. The IC module as set forth in claim 3, wherein a curvature radius of the curved convex face is not less than 1.0 mm and not more than 1.19 mm.

5. The IC module as set forth in claim 1, wherein the counter face, provided on each of the other terminals other than the ground terminal so as to be opposite to the ground terminal, is formed in an arc shape, passing through points positioned away from corner portions of the contactive area by a distance equal to a margin, whose center point is positioned at a line extending via a center of a contactive area of each of the other terminals other than the ground terminal and is positioned in the contactive area, and a line connecting starting points of the curved concave faces of the ground terminal overlaps the curved convex face of each of the other terminals, said corner portions being positioned on a side of the ground terminal, said starting points being included in the curved concave faces positioned opposite to the curved convex face.

6. The IC module as set forth in claim 5, wherein a distance between (i) a line connecting tangent lines of the curved convex face of each of the other terminals other than the ground terminal and (ii) the line connecting the starting points of the curved concave faces opposite to the curved convex faces respectively is not less than 500 μm.

7. The IC module as set forth in claim 1, wherein each of the terminals, provided on the substrate so as to be positioned on the back surface of the substrate including the IC chip, has corner portions, disposed adjacent to each other so as to be positioned on a peripheral portion of the IC module, each of which is formed in a curved shape.

8. The IC module as set forth in claim 7, wherein a curvature radius of each of the corner portions of the terminal is not less than 500 μm, said corner portions being disposed adjacent to each other so as to be positioned on the peripheral portion of the IC module.

9. The IC module as set forth in claim 1, wherein a wiring pattern (A), corresponding to the ground terminal, formed on the substrate so as to be positioned on the surface having the IC chip, and a wiring pattern (B), electrically connected to the other terminals other than the ground terminal, are disposed locally close to each other, said other terminals and said ground terminal being provided on the substrate so as to be positioned on the back surface of the surface having the IC chip.

10. An IC card, comprising the IC module as set forth in claim 1.

11. An IC module, comprising:
    an IC chip provided on one surface of a substrate; and
    a terminal group, including a plurality of terminals adjacent to each other, provided on a back surface of the substrate including the IC chip, one of the terminals being a ground terminal and other terminals including a plurality of external connection terminals electrically connected to the IC chip, wherein:

the ground terminal is disposed adjacent to each of the other terminals, provided on the back surface of the surface having the IC chip, so as to have a constant gap between the ground terminal and each of the other terminals, and the other terminals provided on the back surface of the surface having the IC chip include curved convex faces, and the ground terminal includes curved concave faces, each of which is a counter face positioned opposite to each of the curved convex faces of the other terminals so that there is the constant gap between the curved convex face and each of the curved concave faces, and the gap between the ground terminal and each of the other terminals is narrower than a gap between all the other terminals, other than the ground terminal, provided on the back surface of the substrate including the IC chip, wherein a wiring pattern (A), corresponding to the ground terminal, formed on the substrate so as to be positioned on the surface having the IC chip, and a wiring pattern (B), electrically connected to the other terminals other than the ground terminal, are disposed locally close to each other, said other terminals and said ground terminal being provided on the substrate so as to be positioned on the back surface of the surface having the IC chip, and wherein a gap between the wiring pattern (A) and the wiring pattern (B) is narrower than each of the gap between all the other terminals other than the ground terminal that are provided on the substrate so as to be positioned on the back surface of the substrate including the IC chip.

12. An IC card, comprising the IC module as set forth in claim 11.

13. An IC module, comprising:

an IC chip provided on one surface of a substrate; and a terminal group, including a plurality of terminals adjacent to each other, provided on a back surface of the substrate including the IC chip, one of the terminals being a ground terminal and other terminals including a plurality of external connection terminals electrically connected to the IC chip, wherein:

a wiring pattern (A), corresponding to the ground terminal formed on the substrate, and a wiring pattern (B), electrically connected to the other terminals other than the ground terminal, wherein the wiring pattern (A) and the wiring pattern (B), which are disposed locally close to each other, are provided in such a manner that the gap (c) between the wiring pattern (A) and the wiring pattern (B) is equal to or narrower than the gaps (a and b) between the terminals provided so as to be close to each other, said other terminals and said ground terminal being provided on the substrate so as to be positioned on the back surface of the substrate including the IC chip.

14. The IC module as set forth in claim 13, wherein the wiring pattern (A) is provided with a terminal section having a curved concave face, and the wiring pattern (B) is provided with a terminal section having a curved convex face, and the wiring pattern (A) and the wiring pattern (B) are disposed close to each other so that the curved convex face of the terminal section and the curved concave face of the terminal section are opposite to each other.

15. An IC card, comprising the IC module as set forth in claim 13.

16. The IC module as set forth in claim 13, wherein a gap between the wiring pattern (A) and the wiring pattern (B) is narrower than a gap between all the terminals provided on the substrate so as to be positioned on the back surface of the surface having the IC chip.

17. An IC module, comprising:

an IC chip provided on one surface of a substrate; and a terminal group, including a plurality of terminals adjacent to each other, provided on a back surface of the substrate including the IC chip, one of the terminals being a ground terminal and other terminals including a plurality of external connection terminals electrically connected to the IC chip, wherein:

a wiring pattern (A), corresponding to the ground terminal formed on the substrate so as to be positioned on the surface having the IC chip, and a wiring pattern (B), electrically connected to the other terminals other than the ground terminal, are disposed locally close to each other, said other terminals and said ground terminal being provided on the substrate so as to be positioned on the back surface of the substrate including the IC chip, wherein a gap between the wiring pattern (A) and the wiring pattern (B) is narrower than a gap between all the terminals provided on the substrate so as to be positioned on the back surface of the surface having the IC chip.

18. An IC card, comprising the IC module as set forth in claim 17.

* * * * *